(12) United States Patent
Pachamuthu et al.

(10) Patent No.: US 9,478,495 B1
(45) Date of Patent: Oct. 25, 2016

(54) THREE DIMENSIONAL MEMORY DEVICE CONTAINING ALUMINUM SOURCE CONTACT VIA STRUCTURE AND METHOD OF MAKING THEREOF

(71) Applicant: SANDISK TECHNOLOGIES INC., Plano, TX (US)

(72) Inventors: Jayavel Pachamuthu, San Jose, CA (US); Peter Rabkin, Cupertino, CA (US); Jilin Xia, Milpitas, CA (US); Christopher Petti, Mountain View, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/922,516

(22) Filed: Oct. 26, 2015

(51) Int. Cl.
*H01L 23/52* (2006.01)
*H01L 23/532* (2006.01)
(Continued)

(52) U.S. Cl.
CPC ....... *H01L 23/53223* (2013.01); *H01L 21/324* (2013.01); *H01L 21/76802* (2013.01); *H01L 21/76831* (2013.01); *H01L 21/76843* (2013.01); *H01L 21/76879* (2013.01); *H01L 23/528* (2013.01); *H01L 23/5226* (2013.01);
(Continued)

(58) Field of Classification Search
CPC .................. H01L 23/53223; H01L 29/4234; H01L 21/76802; H01L 23/53204; H01L 27/11556; H01L 21/76843; H01L 23/5226; H01L 29/16; H01L 27/11568; H01L 29/66825; H01L 21/324; H01L 29/04; H01L 27/11519
See application file for complete search history.

(56) References Cited

U.S. PATENT DOCUMENTS 3,414,892 A 12/1968 McCormack et al.
3,432,827 A 3/1969 Samo
(Continued)

FOREIGN PATENT DOCUMENTS

EP 0073486 A2 8/1982
EP 0387834 A2 9/1990
(Continued)

OTHER PUBLICATIONS

Ishii, T. et al., "A 3-D Single-Electron-Memory Cell Structure with 2f2 per Bit," International Electron Devices Meeting, Washington, DC, Dec. 7-10, 1997.
(Continued)

*Primary Examiner* — Roy Potter
*Assistant Examiner* — Paul Patton
(74) *Attorney, Agent, or Firm* — The Marbury Law Group PLLC

(57) ABSTRACT

A low-stress contact via structure for a device employing an alternating stack of insulating layers and electrically conductive layers over a substrate can be formed by forming a trench extending to the substrate through the alternating stack. After formation of an insulating spacer and a diffusion barrier layer, a remaining volume of the trench can be filled with a combination of an aluminum portion and a non-metallic material portion to form a contact via structure. The non-metallic material portion can include a semiconductor material portion or a dielectric material portion, and can prevent reflow of the aluminum portion and generation of a cavity in subsequent thermal processes. If a semiconductor material portion is employed, the aluminum portion and the semiconductor material portion can exchange places during a metal induced crystallization anneal process of the semiconductor material.

27 Claims, 24 Drawing Sheets

(51) Int. Cl.
  *H01L 29/16* (2006.01)
  *H01L 29/04* (2006.01)
  *H01L 29/423* (2006.01)
  *H01L 21/768* (2006.01)
  *H01L 21/324* (2006.01)
  *H01L 29/792* (2006.01)
  *H01L 29/66* (2006.01)
  *H01L 27/115* (2006.01)
  *H01L 29/788* (2006.01)
  *H01L 23/522* (2006.01)
  *H01L 23/528* (2006.01)

(52) U.S. Cl.
  CPC ..... *H01L23/5329* (2013.01); *H01L 23/53204* (2013.01); *H01L 27/11519* (2013.01); *H01L 27/11521* (2013.01); *H01L 27/11556* (2013.01); *H01L 27/11565* (2013.01); *H01L 27/11568* (2013.01); *H01L 27/11582* (2013.01); *H01L 29/04* (2013.01); *H01L 29/16* (2013.01); *H01L 29/4234* (2013.01); *H01L 29/42324* (2013.01); *H01L 29/66825* (2013.01); *H01L 29/66833* (2013.01); *H01L 29/7889* (2013.01); *H01L 29/7926* (2013.01)

(56) References Cited

U.S. PATENT DOCUMENTS

| | | |
|---|---|---|
| 3,571,809 A | 3/1971 | Nelson |
| 3,573,757 A | 4/1971 | Adams |
| 3,576,549 A | 4/1971 | Hess |
| 3,582,908 A | 6/1971 | Koo |
| 3,629,863 A | 12/1971 | Neale |
| 3,634,929 A | 1/1972 | Yoshida et al. |
| 3,671,948 A | 6/1972 | Cassen et al. |
| 3,699,543 A | 10/1972 | Neale |
| 3,717,852 A | 2/1973 | Abbas et al. |
| 3,728,695 A | 4/1973 | Frohman-Bentchkowsky |
| 3,787,822 A | 1/1974 | Rioult |
| 3,846,767 A | 11/1974 | Cohen |
| 3,863,231 A | 1/1975 | Taylor |
| 3,877,049 A | 4/1975 | Buckley |
| 3,886,577 A | 5/1975 | Buckley |
| 3,922,648 A | 11/1975 | Buckley |
| 3,980,505 A | 9/1976 | Buckley |
| 3,990,098 A | 11/1976 | Mastrangelo |
| 4,037,243 A | 7/1977 | Hoffman et al. |
| 4,146,902 A | 3/1979 | Tanimoto et al. |
| 4,177,475 A | 12/1979 | Holmberg |
| 4,203,123 A | 5/1980 | Shanks |
| 4,203,158 A | 5/1980 | Frohman-Bentchkowsky et al. |
| 4,272,880 A | 6/1981 | Pashley |
| 4,281,397 A | 7/1981 | Neal et al. |
| 4,355,375 A | 10/1982 | Arakawa |
| 4,419,741 A | 12/1983 | Stewart et al. |
| 4,420,766 A | 12/1983 | Kasten |
| 4,442,507 A | 4/1984 | Roesner |
| 4,489,478 A | 12/1984 | Sakurai |
| 4,494,135 A | 1/1985 | Moussie |
| 4,498,226 A | 2/1985 | Inoue et al. |
| 4,499,557 A | 2/1985 | Holmberg et al. |
| 4,500,905 A | 2/1985 | Shibata |
| 4,507,757 A | 3/1985 | McElroy |
| 4,535,424 A | 8/1985 | Reid |
| 4,543,594 A | 9/1985 | Mohsen et al. |
| 4,569,121 A | 2/1986 | Lim et al. |
| 4,630,096 A | 12/1986 | Drye et al. |
| 4,639,893 A | 1/1987 | Eitan |
| 4,646,266 A | 2/1987 | Ovshinsky et al. |
| 4,672,577 A | 6/1987 | Hirose |
| 4,677,742 A | 7/1987 | Johnson |
| 4,692,994 A | 9/1987 | Moniwa et al. |
| 4,710,798 A | 12/1987 | Marcantonio |
| 4,728,626 A | 3/1988 | Tu |
| 4,729,005 A | 3/1988 | Wei et al. |
| 4,774,556 A | 9/1988 | Fujii et al. |
| 4,811,082 A | 3/1989 | Jacobs |
| 4,811,114 A | 3/1989 | Yamamoto et al. |
| 4,820,657 A | 4/1989 | Hughes et al. |
| 4,823,181 A | 4/1989 | Mohsen et al. |
| 4,876,220 A | 10/1989 | Mohsen et al. |
| 4,881,114 A | 11/1989 | Mohsen et al. |
| 4,899,205 A | 2/1990 | Hamdy et al. |
| 4,922,319 A | 5/1990 | Fukushima |
| 4,943,538 A | 7/1990 | Mohsen et al. |
| 4,967,247 A | 10/1990 | Kaga et al. |
| 5,001,539 A | 3/1991 | Inoue et al. |
| 5,006,909 A | 4/1991 | Kosa |
| 5,070,383 A | 12/1991 | Sinar et al. |
| 5,070,384 A | 12/1991 | McCollum et al. |
| 5,089,862 A | 2/1992 | Warner, Jr. et al. |
| 5,091,762 A | 2/1992 | Watanabe |
| 5,160,987 A | 11/1992 | Pricer et al. |
| 5,191,405 A | 3/1993 | Tomita et al. |
| 5,191,551 A | 3/1993 | Inoue |
| 5,202,754 A | 4/1993 | Bertin et al. |
| 5,266,912 A | 11/1993 | Kledzik |
| 5,268,319 A | 12/1993 | Harari |
| 5,270,562 A | 12/1993 | Wuidart |
| 5,283,458 A | 2/1994 | Stokes et al. |
| 5,283,468 A | 2/1994 | Kondo et al. |
| 5,306,935 A | 4/1994 | Esquivel et al. |
| 5,311,039 A | 5/1994 | Kimura et al. |
| 5,321,286 A | 6/1994 | Koyama et al. |
| 5,334,880 A | 8/1994 | Abadeer et al. |
| 5,379,255 A | 1/1995 | Shah |
| 5,391,518 A | 2/1995 | Bhushan |
| 5,391,907 A | 2/1995 | Jang |
| 5,397,908 A | 3/1995 | Dennison et al. |
| 5,398,200 A | 3/1995 | Mazure et al. |
| 5,422,435 A | 6/1995 | Takiar et al. |
| 5,426,566 A | 6/1995 | Beilstein, Jr. |
| 5,427,979 A | 6/1995 | Chang |
| 5,434,745 A | 7/1995 | Shokrgozar et al. |
| 5,441,907 A | 8/1995 | Sung et al. |
| 5,453,952 A | 9/1995 | Okudaira |
| 5,455,445 A | 10/1995 | Kurtz et al. |
| 5,463,244 A | 10/1995 | De Araujo et al. |
| 5,468,663 A | 11/1995 | Bertin et al. |
| 5,468,997 A | 11/1995 | Imai et al. |
| 5,471,090 A | 11/1995 | Deutsch |
| 5,481,133 A | 1/1996 | Hsu |
| 5,483,094 A | 1/1996 | Sharma et al. |
| 5,495,398 A | 2/1996 | Takiar et al. |
| 5,502,289 A | 3/1996 | Takiar et al. |
| 5,517,044 A | 5/1996 | Koyama |
| 5,523,622 A | 6/1996 | Harada et al. |
| 5,535,156 A | 7/1996 | Levy et al. |
| 5,536,968 A | 7/1996 | Crafts et al. |
| 5,552,963 A | 9/1996 | Burns |
| 5,557,122 A | 9/1996 | Shrivastava et al. |
| 5,559,048 A | 9/1996 | Inoue |
| 5,561,622 A | 10/1996 | Bertin et al. |
| 5,581,498 A | 12/1996 | Ludwig et al. |
| 5,585,675 A | 12/1996 | Knopf |
| 5,612,570 A | 3/1997 | Eide et al. |
| 5,654,220 A | 8/1997 | Leedy |
| 5,675,547 A | 10/1997 | Koga |
| 5,693,552 A | 12/1997 | Hsu |
| 5,696,031 A | 12/1997 | Wark |
| 5,703,747 A | 12/1997 | Voldman et al. |
| 5,737,259 A | 4/1998 | Chang |
| 5,739,567 A | 4/1998 | Wong |
| 5,745,407 A | 4/1998 | Levy et al. |
| 5,751,012 A | 5/1998 | Wolstenholme et al. |
| 5,751,037 A | 5/1998 | Aozasa et al. |
| 5,768,192 A | 6/1998 | Eitan |
| 5,776,810 A | 7/1998 | Guterman et al. |
| 5,780,925 A | 7/1998 | Cipolla et al. |
| 5,781,031 A | 7/1998 | Bertin et al. |
| 5,801,437 A | 9/1998 | Burns |
| 5,825,046 A | 10/1998 | Czubatyj et al. |
| 5,835,396 A | 11/1998 | Zhang |

(56) References Cited

U.S. PATENT DOCUMENTS

| | | |
|---|---|---|
| 5,840,589 A | 11/1998 | Warner et al. |
| 5,852,317 A | 12/1998 | Berman |
| 5,883,409 A | 3/1999 | Guterman et al. |
| 5,889,302 A | 3/1999 | Liu |
| 5,903,492 A | 5/1999 | Takashima |
| 5,915,167 A | 6/1999 | Leedy |
| 5,930,608 A | 7/1999 | Yamazaki et al. |
| 5,936,280 A | 8/1999 | Liu |
| 5,939,749 A | 8/1999 | Taketa et al. |
| 5,966,603 A | 10/1999 | Eitan |
| 5,969,380 A | 10/1999 | Seyyedy |
| 5,973,356 A | 10/1999 | Noble et al. |
| 5,976,953 A | 11/1999 | Zavracky et al. |
| 5,978,258 A | 11/1999 | Manning |
| 5,981,974 A | 11/1999 | Makita |
| 5,982,003 A | 11/1999 | Hu et al. |
| 5,985,693 A | 11/1999 | Leedy |
| 5,998,808 A | 12/1999 | Matsushita |
| 5,999,453 A | 12/1999 | Kawata |
| 6,005,270 A | 12/1999 | Noguchi |
| 6,011,725 A | 1/2000 | Eitan |
| 6,028,326 A | 2/2000 | Uochi et al. |
| 6,034,882 A | 3/2000 | Johnson et al. |
| 6,057,598 A | 5/2000 | Payne et al. |
| 6,066,547 A | 5/2000 | Maekawa |
| 6,072,193 A | 6/2000 | Ohnuma et al. |
| 6,072,234 A | 6/2000 | Camien et al. |
| 6,075,719 A | 6/2000 | Lowrey et al. |
| 6,087,674 A | 7/2000 | Ovshinsky et al. |
| 6,087,722 A | 7/2000 | Lee et al. |
| 6,100,200 A | 8/2000 | Van Buskirk et al. |
| 6,107,666 A | 8/2000 | Chang |
| 6,110,278 A | 8/2000 | Saxena |
| 6,114,767 A | 9/2000 | Nagai et al. |
| 6,133,640 A | 10/2000 | Leedy |
| 6,137,718 A | 10/2000 | Reisinger |
| 6,141,241 A | 10/2000 | Ovshinsky et al. |
| 6,153,495 A | 11/2000 | Kub et al. |
| 6,157,061 A | 12/2000 | Kawata |
| 6,184,088 B1 | 2/2001 | Kurooka et al. |
| 6,185,122 B1 | 2/2001 | Johnson et al. |
| 6,188,605 B1 | 2/2001 | Nomura et al. |
| 6,191,459 B1 | 2/2001 | Hofmann et al. |
| 6,197,641 B1 | 3/2001 | Hergenrother et al. |
| 6,208,545 B1 | 3/2001 | Leedy |
| 6,211,015 B1 | 4/2001 | Noble |
| RE37,259 E | 7/2001 | Ovshinsky |
| 6,255,705 B1 | 7/2001 | Zhang et al. |
| 6,281,042 B1 | 8/2001 | Ahn et al. |
| 6,285,055 B1 | 9/2001 | Gosain et al. |
| 6,291,858 B1 | 9/2001 | Ma et al. |
| 6,299,338 B1 | 10/2001 | Levinson et al. |
| 6,307,257 B1 | 10/2001 | Huang et al. |
| 6,314,013 B1 | 11/2001 | Ahn et al. |
| 6,322,903 B1 | 11/2001 | Siniaguine et al. |
| 6,323,515 B1 | 11/2001 | Yamazaki et al. |
| 6,335,554 B1 | 1/2002 | Yoshikawa |
| 6,337,521 B1 | 1/2002 | Masuda |
| 6,351,028 B1 | 2/2002 | Akram |
| 6,353,265 B1 | 3/2002 | Michii |
| 6,355,501 B1 | 3/2002 | Fung et al. |
| 6,433,382 B1 | 8/2002 | Orlowski et al. |
| 6,472,684 B1 | 10/2002 | Yamazaki et al. |
| 6,486,027 B1 | 11/2002 | Noble et al. |
| 6,498,369 B1 | 12/2002 | Yamazaki et al. |
| 6,509,602 B2 | 1/2003 | Yamazaki et al. |
| 6,509,638 B2 | 1/2003 | Fujimoto |
| 6,525,962 B1 | 2/2003 | Pai et al. |
| 6,551,857 B2 | 4/2003 | Leedy |
| 6,577,531 B2 | 6/2003 | Kato |
| 6,587,365 B1 | 7/2003 | Salling |
| 6,593,624 B2 | 7/2003 | Walker |
| 6,627,518 B1 | 9/2003 | Inoue et al. |
| 6,653,733 B2 | 11/2003 | Gonzalez et al. |
| 6,713,810 B1 | 3/2004 | Bhattacharyya |
| 6,730,543 B2 | 5/2004 | Akram |
| 6,812,575 B2 | 11/2004 | Furusawa |
| 6,841,813 B2 | 1/2005 | Walker et al. |
| 6,853,049 B2 | 2/2005 | Herner |
| 6,888,750 B2 | 5/2005 | Walker et al. |
| 7,125,763 B1 | 10/2006 | Sobek et al. |
| 7,486,537 B2 | 2/2009 | Scheuerlein et al. |
| 7,800,161 B2 | 9/2010 | Mokhlesi |
| 7,851,851 B2 | 12/2010 | Mokhlesi et al. |
| 8,241,979 B2 | 8/2012 | Park et al. |
| 8,492,238 B2 | 7/2013 | Celik-Butler et al. |
| 8,823,076 B2 | 9/2014 | Lee et al. |
| 2001/0054759 A1 | 12/2001 | Nishiura |
| 2001/0055838 A1 | 12/2001 | Walker et al. |
| 2002/0028541 A1 | 3/2002 | Lee et al. |
| 2002/0030262 A1 | 3/2002 | Akram |
| 2002/0093052 A1 | 7/2002 | Masuda |
| 2002/0142546 A1 | 10/2002 | Kouznetsov et al. |
| 2003/0218920 A1 | 11/2003 | Harari |
| 2005/0052915 A1 | 3/2005 | Herner et al. |
| 2005/0226067 A1 | 10/2005 | Herner et al. |
| 2007/0010100 A1 | 1/2007 | Raghuram et al. |
| 2007/0029607 A1 | 2/2007 | Kouznetzov |
| 2007/0114509 A1 | 5/2007 | Herner |
| 2009/0168507 A1 | 7/2009 | Petti |
| 2010/0323489 A1 | 12/2010 | Park et al. |
| 2011/0151667 A1 | 6/2011 | Hwang et al. |
| 2011/0156044 A1 | 6/2011 | Lee et al. |
| 2012/0223380 A1 | 9/2012 | Lee et al. |
| 2013/0126957 A1 | 5/2013 | Higashitani et al. |
| 2014/0225180 A1 | 8/2014 | Lee et al. |
| 2015/0179660 A1 | 6/2015 | Yada |
| 2016/0079265 A1* | 3/2016 | Akutsu ............ H01L 27/11582 257/314 |

FOREIGN PATENT DOCUMENTS

| | | |
|---|---|---|
| EP | 0395886 A2 | 11/1990 |
| EP | 0516866 A1 | 12/1992 |
| EP | 0606653 A1 | 7/1994 |
| EP | 0644548 A2 | 9/1994 |
| EP | 0800137 A1 | 3/1997 |
| EP | 0933817 A2 | 8/1999 |
| EP | 0971416 A4 | 1/2000 |
| EP | 1017100 A1 | 7/2000 |
| JP | 61-222216 | 10/1986 |
| JP | 5-082787 | 4/1993 |
| JP | 60-22352 | 1/1994 |
| JP | 60-338602 | 12/1994 |
| JP | 63-52463 | 3/1998 |
| KR | 10-190016 | 6/1999 |
| WO | WO94/26083 | 11/1994 |
| WO | WO00/30118 | 5/2000 |

OTHER PUBLICATIONS

"3D Chip-on-Chip Stacking," Semiconductor International, Dec. 1991.
Abou-Samra, "3D CMOS SOI for High Performance Computing," Low Power Electronics and Design Proceedings, 1998.
Arienzo et al., "Diffusion of Arsenic in Bilayer Polycrystalline Silicon Films," J. Appl. Phys. Jan. 1984, pp. 365-369, vol. 55, No. 2, American Institute of Physics.
Aritome, "Advanced Rash Memory Technology and Trends for File Storage Application," IEEE, 2000.
Bellezza et al., "A New Self-Aligned Field Oxide Cell for Multimegabit Eproms," IEDM, pp. 579-582, IEEE.
Bertin, "Evaluation of a Three-Dimensional Memory Cube System," IEEE Transactions on Components, Hybrids, and Manufacturing Technology, vol. 16, No. 8, Dec. 1993, pp. 1006-1011.
Brotherton et al., "Excimer-Laser-Annealed Poly-Si Thin-Film Transistors," IEEE Transactions on Electron Devices, Feb. 1993, pp. 407-413, vol. 40, No. 2, IEEE.
Burnett et al, "An Advanced Flash Memory Technology on SOI," 1998, pp. 983-986, IEEE.

(56) References Cited

OTHER PUBLICATIONS

Camperi-Ginestet, "Vertical Electrical Interconnection of Compound Semiconductor Thin-Film Devices to Underlying Silicon Circuitry," IEEE Photonics Technology Letters, vol. 4, No. 9, Sep. 1992, pp. 1003-1006.
Candelier et al., "Simplified 0.35-µm Flash EEPROM Process Using High-Temperature Oxide (HTO) Deposited by LPCVD as Interpoly Dielectrics and Peripheral Transistors Gate Oxide," IEEE Electron Device Letters, Jul. 1997, pp. 306-308, vol. 18, No. 7.
Cao et al, "A High-Performance Polysilicon Thin-Film Transistor Using XeCl Excimer Laser Crystallization of Pre-Patterned Amorphous Si Films," IEEE Transactions on Electron Devices, Apr. 1996, pp. 561-567, vol. 43, No. 4.
Cao et al., "A Simple EEPROM Cell Using Twin Polysilicon Thin-Film Transistors," IEEE Electron Device Letters, Aug. 1994, pp. 304-306, vol. 15, No. 8.
Carter, W., "National Science Foundation Forum on Optical Science and Engineering," Proceedings SPIE—The International Optical Society for Engineering, vol. 2524, Jul. 11-12, 1995, (Article by N. Joverst, "Manfacturable Multi-Material Integration Compound Semi-conductor Devices Bonded to Silicon Circuitry."
Chan et al., "Three Dimensional CMOS Integrated Circuits on Large Grain Polysilicon Films," IEEE Hong Kong University of Science and Technology, 2000.
Chatterjee et al, CMOS Metal Replacement Gate Transistors Using Tantalum Pentoxide Gate Insulator, 1998, pp. 777-780, IEEE.
Chatterjee et al., "Sub-100nm Gate Length Metal Gate NMOS Transistors Fabricated by a Replacement Gate Process," 1997, pp. 821-824, IEEE.
Chen et al., "Yield Improvement for a 3.5ns BICMOS Technology in a 200-mm Manufacturing Line," IBM Technology Products, 1993, pp. 301-305, VLSITSA.
Chi et al., "Programming a Erase with Floating-Body for High Density Low Voltage Flash EEPROM Fabricated on SOI Wafters," Proceedings 1995 IEEE International SOI Conference, Oct. 1995, pp. 129-130.
Choi et al., "A 0.15µm NAND Flash Technology with 0.11µm$^2$ Cell Size for 1 Gbit Flash Memory," IEEE 2000.
De Graaf et al., "A Novel High-Density, Low-Cost Diode Programmable Read Only Memory," IEDM, starts p. 189.
Dipert, "Exotic Memories, Diverse Approaches," EDN Asia, Sep. 2001.
Douglas, "The Route to 3D Chips," High Technology, Sep. 1983, pp. 55-59, vol. 3, No. 9.
Eitan et al., "Alternate Metal Virtual Ground (AMG)—A New Scaling Concept for Very High-Density EPROM's," IEEE Electron Device Letters, pp. 450-452, vol. 12, No. 8, Aug. 1991.
Eitan et al., "NROM: A Novel Localized Trapping, 2-Bit Nonvolatile Memory Cell," IEEE Electron Device Letters, vol. 21, No. 11, Nov. 2000, pp. 543-545.
Endert, "Excimer Lasers as Tools for Material Processing in Manufacturing," Technical Digest: International Electron Devices Meeting, 1985, pp. 28-29, Washington, DC, Dec. 1-4, 1985.
Esquivel et al., "High Density Contactless, Self Aligned EPROM Cell Array Technology," Texas Instruments, IEDM 1986, pp. 592-595.
Frohman-Bentchkowsky, "A Fully Decoded 2048-Bit Electrically Programmable FAMOS Read-Only Memory," IEEE Journal of Solid-State Circuits, pp. 301-306, vol. sc-6, No. 5, Oct. 1971.
Fujiwara et al., "0.13µm Metal-Oxide-Nitride-Oxide Semiconductor Single Transistor Memory Cell with Separated Source Line," Feb. 2000, Jpn J. Appl. Phys., vol. 39, Part 1, No. 2A.
Giust et al., "High-Performance Laser-Processed Polysilicon Thin-Film Transistors," IEEE Electron Device Letters, pp. 77-79, vol. 20, No. 2, Feb. 1999.
Giust et al., "High-Performance Thin-Film Transistors Fabricated Using Excimer Laser Processing and Grain Engineering," IEEE Transactions on Electron Devices, pp. 925-932, vol. 45, No. 4, Apr. 1998.
Giust et al., "Laser-Processed Thin-Film Transistors Fabricated from Sputtered Amorphous-Silicon Films," IEEE Transactions on Electron Devices, pp. 207-213, vol. 47, No. 1, Jan. 2000.
Gogl et al., "A 1-Kbit EEPROM in SIMOX Technology for High-Temperature Applications up to 250° C.," IEEE Journal of Solid-State Circuits, Oct. 2000, vol. 35, No. 10.
Hardee et al, "A Fault-Tolerant 30ns/375mW 16k×1 NMOS Static RAM," IEEE Journal of Solid State Circuits, Oct. 1981, vol. SC-16, No. 5, pp. 435-443.
Hayashi et al., "A Self-Aligned Split-Gate Flash EEPROM Cell with 3D Pillar Structure," 1999 Symposium on VLSI Technology Digest of Technical Papers, pp. 87-88, Stanford University.
Hayzelden et al., "Silicide Formation and Silicide-Mediated Crystallization of Nickel-Implanted Amorphous Silicon Thin Films," J. Appl. Phys., Jun. 16, 1993, pp. 8279-8289, 73 (12), 1993.
Watanabe, H. et al., "Stacked Capacitor Cells for High-Density Dynamic RAMs," IEDM, 1988, pp. 600-603.
Ho et al., "Thermal Stability of Nickel Suicides in Different Silicon Substrates," Department of Electrical and Electronic Engineering, pp. 105-108, 1998, IEEE.
Hur et al., "A Poly-Si Thin-Film Transistor EEPROM Cell with a Folded Floating Gate," IEEE Transactions on Electron Devices, Feb. 1999, pp. 436-438, vol. 46, No. 2, Feb. 1999.
Inoue, "A Three-Dimensional Static RAM," IEEE Electron Device Letters, vol. 7, No. 5, May 1986, pp. 327-329.
Jagar et al., "Characterization of MOSFET's Fabricated on Large-Grain Polysilicon on Insulator," Solid-State Electronics 45, 2001, pp. 743-749.
Jin et al., "The Effects of Extended Heat Treatment on Ni Induced Lateral Crystallization of Amorphous Silicon Thin Films," IEEE Transactions on Electron Devices, vol. 46, No. 1, Jan. 1999, pp. 78-82.
Kazerounian et al., Alternate Metal Virtual Ground EPROM Array Implemented in a 0.6µm Process for Very High Density Applications, IEDM 91, pp. 311-314, 1991, IEEE.
Kim et al., "A Novel Dual String NOR (DuSNOR) Memory Cell Technology Scalable to the 256Mbit and 1Gbit Flash Memories," IEDM, 1995, pp. 263-266, IEEE.
Kitamura et al., "A Low Voltage Operating Flash Memory Cell with High Coupling Ratio Using Horned Floating Gate with Fine HSG," IEEE, 1998, pp. 104-105.
Klootwijk et al., "Deposited Inter-Polysilicon Dielectrics for Nonvolatile Memories," IEEE Transactions on Electron Devices, pp. 1435-1445, vol. 46, No. 7, Jul. 1999.
Koyama, "A Novel Cell Structure for Giga-bit EPROMs and Flash Memories Using Polysilicon Thin Film Transistors," Symposium on VLSI Technology Digest of Technical Papers, 1992, pp. 44-45.
Lee et al., "High-Performance EEPROMs Using N-and P-Channel Polysilicon Thin-Film Transistors with Electron Cycletron Resonance N2O-Plasma Oxide," pp. 15-17, IEEE Electron Device Letters, vol. 20, No. 1, Jan. 1999.
Lee et al., "Improved Stability of Polysilicon Thin-Film Transistors under Self-Heating and High Endurance EEPROM Cells for Systems-On-Panel," IEEE Electron Device Letters, 1998, pp. 265-268.
Lee et al., "Pd Induced lateral crystallization of Amorphous Si thin films," Appl. Phys. Lett. 66 (13) pp. 1671-1673, Mar. 1995.
Lee et al., "Three Dimensional Shared Memory Fabricated Using Wafer Stacking Technology," 2000, IEEE.
Lindsey et al., "Polysilicon Thin Film Transistor for Three Dimensional Memory," Electrochemical Society Meeting 198th, Oct. 2000, Phoenix, AZ.
Liu et al., "Scaled Dielectric Antifuse Structure for Field-Programmable Gate Array Applications," IEEE Electron Device Letters, Apr. 1991, pp. 151-153, vol. 12, No. 4.
Maliniak, D., "Vertical Integration of Silicon Allows Packaging of Extremely Dense System Memory in Tiny Volumes: Memory-chip Stacks Send Density Skyward," Electronic Design, No. 17, Aug. 22, 1994, pp. 69-75.
Miyashita et al., "Optimized Halo Structure for 80nm Physical Gate CMOS Technology with Indium and Antimony Highly Angled Ion Implementation," IEDM 1999, pp. 27.2.1-27.2.4.
Naji et al., "A 256kb 3.0V 1T1MTJ Nonvolatile Magnetoresistive RAM," 2001 IEEE International Solid State Circuits Conference,

(56) References Cited

OTHER PUBLICATIONS

Digest of Technical Papers, ISSCC 2001/Session 7/Technology Directions: Advanced Technologies/7.6, Feb. 6, 2001, pp. 122-123 (including enlargement of figures, totaling 9 pages), and associated Visual Supplement, pp. 94-95, 404-405.
Oh et al., "A High-Endurance Low Temperature Polysilicon Thin Film Transistor EEPROM Cell," pp. 304-306, IEEE Electron Device Letters, vol. 21, No. 6, Jun. 2000.
Pein, "Performance of the 3D Pencil Flash EPROM Cell and Memory Array," IEEE Transactions on Electron Devices, vol. 42, No. 11, Nov. 1995, pp. 1982-1991.
Xu et al., "New Ti-SALICIDE Process Using Sb and Ge Preamorphization for Sub-0.2µm CMOS Technology," IEEE Transactions on Electron Devices, pp. 2002-2009, vol. 45, No. 9, Sep. 1998.
Reber, :"Benefits of Vertically Stacked Integrated Circuits for Sequential Logic," IEEE 1996, pp. 121-124.
Sakamoto, "Architecture of Three Dimensional Devices," Bulletin of the Electrotechnical Laboratory, ISSN 0366-9092, vol. 51, No. 1, 1987, pp. 16-29.
Sato et al., "A 0.5-µm EEPROM Cell Using Poly-Si TFT Technology," IEEE Transactions on Electron Devices, vol. 40, No. 11, Nov. 1993, p. 2126.
Sato et al. "A New Programmable Cell Utilizing Insulator Breakdown," IEDM 1985, pp. 639-642, IEEE.
Schlaeppi, "nd Core Memories using Multiple Coincidence," IRE Transactions on Electronic Computers, Jun. 1960, pp. 192-196.
Schlaeppi, "Session V: Information Storage Techniques," International Solid State Circuits Conference, Feb. 11, 1960, pp. 54-55.
Thakur, S. et al., "An Optimal Layer Assignment Algorithm for Minimizing Crosstalk for Three VHV Channel Routing," IEDM, 1995, pp. 207-210.
Shiba et al., "In Situ Phosphorus-Doped Polysilicon Emitter Technology for Very High Speed, Small Emitter Bipolar Transistors," IEEE Transactions on Electron Devices, pp. 889-897, vol. 43, No. 6, Jun. 1996.
Shirai et al., "A 0.54µm² Self-Aligned, HSG Floating Gate Cell (SAHF Cell) for 356Mbit Flash Memories," IEEE, 1995, pp. 653-656.
Song et al., "High Performance Transistors with State of the art CMOS Technologies," IEDM 1999, pp. 427-430, IEEE.
Stern, Design and Evaluation of an Epoxy Three Dimensional Multichip Module, IEEE Transactions on Components, Packaging, and Manufacturing Technology—Part B, vol. 19, No. 1, Feb. 1996., pp. 188-194.
Subramanian et al., "Low Leakage Germanium Seeded Laterally Crystallized Single Grain 100-nm TFTs for Vertical Integration Applications," IEEE Electron Device Letters, vol. 20, No. 7, Jul. 1999, pp. 341-343.
Subramanian et al., "High Performance Germanium Seeded Laterally Crystallized TFTs for Vertical Device Integration," IEEE Transactions on Electron Devices, vol. 45, No. 9, Sep. 1999, pp. 1934-1939.
Subramanian, "Control of Nucleation and Grain Growth in Solid Phase Crystallized Silicon for High Performance Thin Film Transistors," Dissertation to the Department of Electrical Engineering and the Committee of Graduate Studies, Stanford University, Jun. 1998.
Kurokawa, T. et al., "3D VLSI Technology in Japan and an Example: A Syndrome Decoder for Double Error Correction," FGCS, vol. 4, No. 2, 1988, pp. 145-155.
Takao et al.; "Low Power and High Stability SRAM Technology Using a Laser-Recrystallized p-channel SOI MOSFET," IEEE Transactions on Electron Devices, pp. 2147-2152, vol. 39, No. 9, Sep. 1992.
Takeuchi et al., "A Dual Page Programming Scheme for High Speed Multigigabit-Scale NAND Flash Memories," IEEE Journal of Solid State Circuits, May 2001, pp. 744-751, vol. 36, No. 5.

Taniguchi et al., "Process Modeling and Simulation: Boundary Conditions for Point Defect-Based Impurity Diffusion Model," IEEE Transactions on Computer-Aided Design, pp. 1177-1183, vol. 9, No. 11, Nov. 1990.
Terril, "3D Packaging Technology Overview and Mass Memory Applications," IEDM 1996, pp. 347-355.
Wada et al., "A 15-ns 1024-Bit Fully Static MOS RAM," IEEE Journal of Solid State Circuits, Oct. 1978, vol. SC-13, No. 5, pp. 635-639.
Wang et al., "Submicron Super TFTs for 3D VLSI Applications," IEEE Electron Device Letters, Sep. 2000, pp. 439-441, vol. 21, No. 9.
Wang et al., "Submicron Super TFTs for 3D VLSI Applications," IEEE Electron Device Letters, Sep. 2000, pp. 391-393, vol. 21, No. 9.
Wang et al., "Super Thin Film Transistor with SOI CMOS Performance Formed by a Novel Grain Enhancement Method," IEEE Transactions on Electron Devices, pp. 1580-1586, vol. 47, No. 8, Aug. 2000.
Ku et al., High Performance pMOSFETs with Ni(Si/sub x/Ge/sub 1−x Si/Sub 0.8/Ge/sub 0.2/gate, IEEE Xplore Citation, VLSI Technology 2000, digest of Technical Papers, pp. 114-115, Jun. 13-15, 2000.
White et al., "A Low Voltage SONOS Nonvolatile Semiconductor Memory Technology," IEEE Transactions on Components, Packaging, and Manufacturing Technology, Part A, vol. 20, No. 2, Jun. 1997, pp. 190-195.
White et al., "On the Go with SONOS," Circuit and Devices, pp. 22-31, Jul. 2000.
Woo et al., "A Novel Memory Cell Using Flash Array Contactless EPROM (Face) Technology," IEDM 1990, pp. 90-93, IEEE.
Xiang et al., "Deep Sub-100nm CMOS with Ultra Low Gate Sheet Resistance by NiSi," IEEE pp. 76-77, 2000, Symposium on VLSI Technology, Digest of Technical Papers.
Yamanaka et al., "Advanced TFT SRAM Cell Technology Using a Phase-Shift Lithography," IEEE Transactions on Electron Devices, Jul. 1995, pp. 1305-1313, vol. 42, No. 7.
Yamazaki, "Fabrication Technologies for Dual 4-Kbit Stacked SRAM," IEDM 18.8., 1986, pp. 435-438.
Akasaka, Y., "Three Dimensional Integrated Circuit: Technology and Application Prospect," Microelectronics Journal, vol. 20, Nos. 1-2, 1989, pp. 105-112.
Akasaka, Y., "Three Dimensional IC Trends," Proceedings of the IEEE, vol. 74, No. 12, 1986, pp. 1703-1714.
Yoshikawa et al., "An Asymmetrical Lightly Doped Source Cell for Virtual Ground High Density EPROMs," IEEE Transactions on Electron Devices, pp. 1046-1051, vol. 37, No. 4, Apr. 1990.
Young et al., "The Fabrication and Characterization of EEPROM Arrays on Glass Using a Low Temperature Poly-Si TFT Process," IEEE Transactions on Electron Devices, pp. 1930-1936, vol. 43, No. 11, Nov. 1996.
Zhang, "3D-ROM-A First Practical Step Towards 3D-IC," Semiconductor International, Jul. 2000.
Office Communication Concerning Corresponding U.S. Appl. No. 14/501,539, filed Sep. 30, 2014, (19 pages).
Hayashi, Y. et al., "A New Three Dimensional IC Fabrication Technology, Stacking Thin Film Dual-CMOS Layers," Microelectronics Research Laboratories, 4 pages (1991).
Yamazaki, K. et al., "4-Layer 3-D IC Technologies for Parallel Signal Processing," Semiconductor Research Center, 5 pages, (2002).
Kim, C.D. et al., "Short-Channel Amorphous-Silicon Thin-Film Transistors," IEEE Transactions on Electron Devices, vol. 43, No. 12, pp. 2172-2176, (1996).
Poon, M.C. et al., "Thermal Stability of Cobalt and Nickel Silicides in Amorpho Crystalline Silicon," IEEE Xplore Citation, 1 page, (1997).
U.S. Appl. No. 14/225,116, filed Mar. 25, 2014, SanDisk Technologies Inc.
U.S. Appl. No. 14/225,176, filed Mar. 25, 2014, SanDisk Technologies Inc.
U.S. Appl. No. 14/317,274, filed Jun. 27, 2014, San Disk Technologies, Inc.

(56) References Cited

OTHER PUBLICATIONS

U.S. Appl. No. 14/468,743, filed Aug. 26, 2014, SanDisk Technologies Inc.
U.S. Appl. No. 14/491,315, filed Sep. 19, 2014, SanDisk Technologies Inc.
U.S. Appl. No. 14/491,026, filed Sep. 19, 2014, SanDisk Technologies Inc.
U.S. Appl. No. 14/462,209, filed Aug. 14, 2014, SanDisk Technologies Inc.
U.S. Appl. No. 14/501,539, filed Sep. 30, 2014, SanDisk Technologies Inc.
U.S. Appl. No. 14/520,084, filed Oct. 21, 2014, SanDisk Technologies, Inc.
U.S. Appl. No. 14/540,479, filed Nov. 13, 2014, SanDisk Technologies Inc.
U.S. Appl. No. 14/602,491, filed Jan. 22, 2015, SanDisk Technologies Inc.
U.S. Appl. No. 14/619,691, filed Feb. 11, 2015, SanDisk Technologies, Inc.

\* cited by examiner

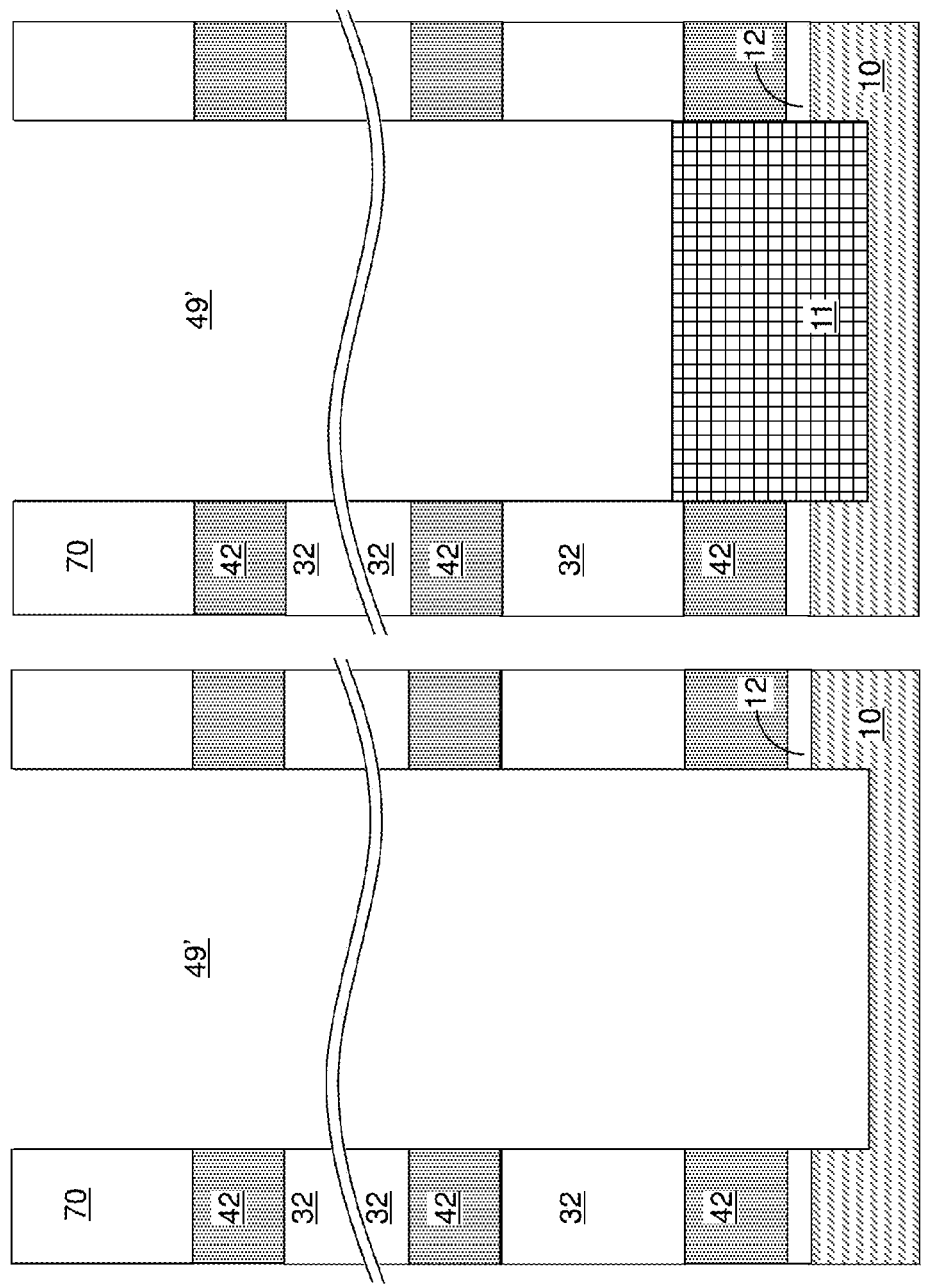

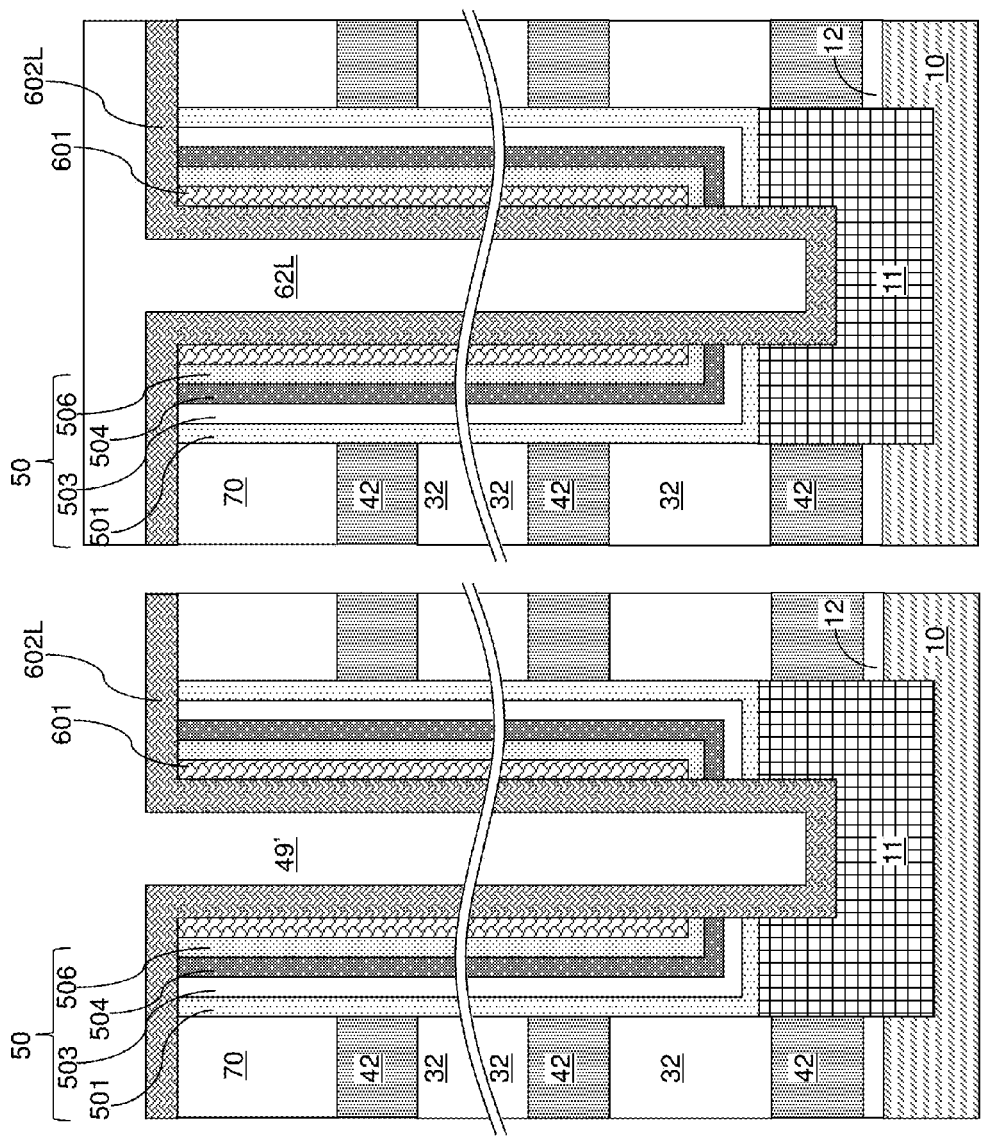

US 9,478,495 B1

THREE DIMENSIONAL MEMORY DEVICE CONTAINING ALUMINUM SOURCE CONTACT VIA STRUCTURE AND METHOD OF MAKING THEREOF

FIELD

The present disclosure relates generally to the field of semiconductor devices and specifically to three-dimensional memory structures, such as vertical NAND strings and other three-dimensional devices, and methods of making thereof.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a structure is provided, which comprises an alternating stack of insulating layers and electrically conductive layers located over a substrate, and a contact via structure extending through the alternating stack. A bottom of the contact via structure contacts a top surface of a doped semiconductor portion. The contact via structure comprises an electrically conductive diffusion barrier layer, and a combination of an aluminum portion and a non-metallic material portion. The combination of the aluminum portion and the non-metallic material portion is laterally surrounded by the diffusion barrier layer.

According to another aspect of the present disclosure, a method of manufacturing a structure is provided. The method comprises forming an alternating stack comprising insulating layers and electrically conductive layers over a substrate, forming a trench extending to the substrate through the alternating stack, forming an insulating spacer on a sidewall of the trench, wherein a cavity is provided within the insulating spacer, forming an electrically conductive diffusion barrier layer in the cavity, and filling a remaining portion of the cavity with a combination of an aluminum portion and a non-metallic material portion. The combination of the aluminum portion and a non-metallic material portion and a portion of the diffusion barrier layer constitute a contact via structure extending through the alternating stack and contacting a top surface of a doped semiconductor portion.

BRIEF DESCRIPTION OF THE DRAWINGS

FIGS. 2A-2H are sequential vertical cross-sectional views of a memory opening within the first exemplary structure during various processing steps employed to form a memory stack structure according to the first embodiment of the present disclosure.

DETAILED DESCRIPTION

Figure 1:
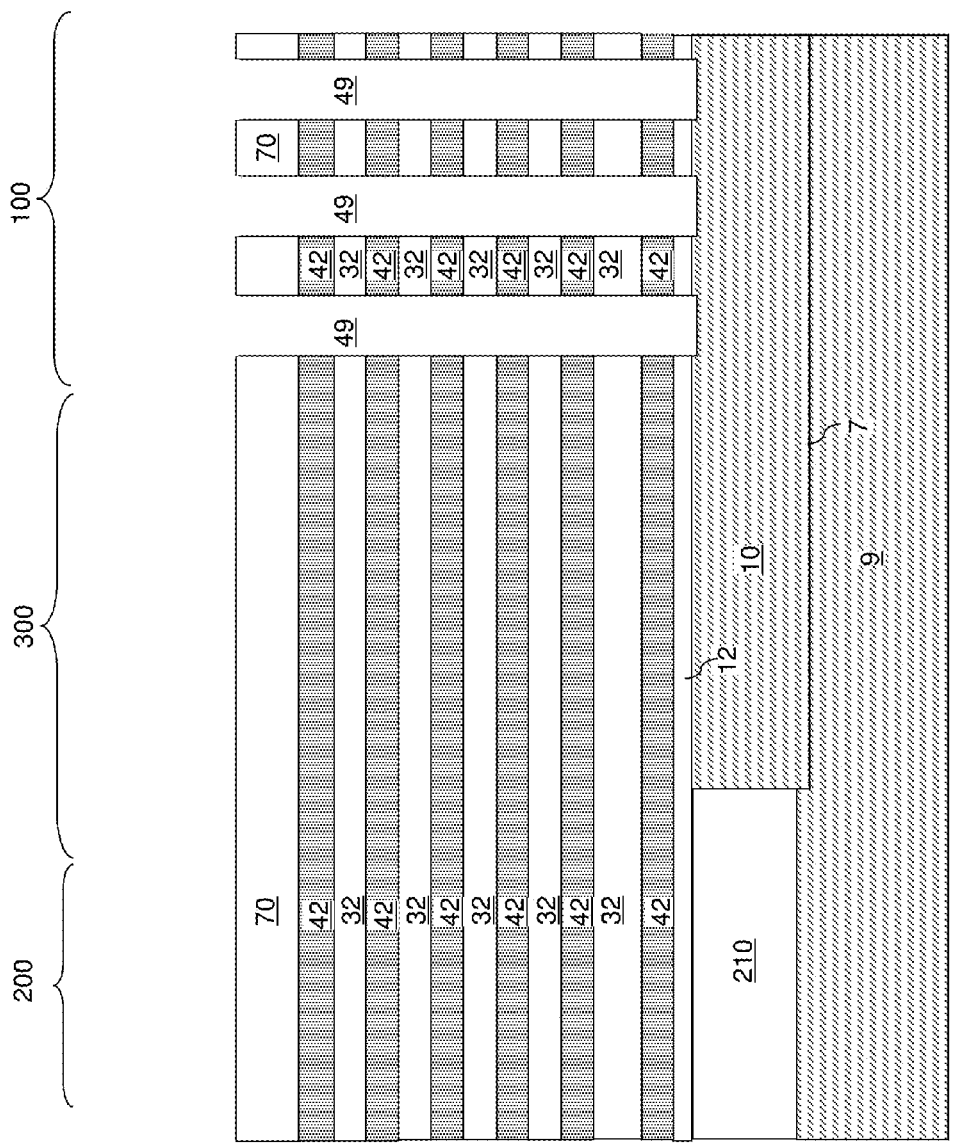
FIG. 1 is a vertical cross-sectional view of a first exemplary structure after formation of an alternating stack of insulating layers and sacrificial material layers and memory openings extending through the alternating stack according to a first embodiment of the present disclosure.

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a substantially uniform thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor. A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to an embodiment of the present disclosure is illustrated, which can be employed, for example, to fabricate a device structure containing vertical NAND memory devices. The first exemplary structure includes a substrate 9, which can be a semiconductor substrate (e.g., a single crystalline silicon wafer). The substrate can include a semiconductor substrate layer 10 located over or in the top surface 7 of the substrate 9. The semiconductor substrate layer 10 is a semiconductor material layer, and can include at least one elemental semiconductor material (e.g., silicon, such as single crystalline silicon), at least one III-V compound semiconductor material, at least one II-VI compound semiconductor material, at least one organic semiconductor material, or other semiconductor materials known in the art.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. All measurements for electrical conductivities are made at the standard condition. The semiconductor substrate layer 10 can include at least one doped well or layer 10 may comprise a doped well in the substrate 9 having a substantially uniform dopant concentration therein.

The first exemplary structure can have multiple regions for building different types of devices. Such areas can include, for example, a device region 100, a contact region 300, and a peripheral device region 200. In one embodiment, the semiconductor substrate layer 10 can include at least one a doped well in the device region 100. As used herein, a "doped well" refers to a portion of a semiconductor material having a doping of a same conductivity type (which can be p-type or n-type) and a substantially same level of dopant concentration throughout. The doped well can be the same as the semiconductor substrate layer 10 or can be a portion of the semiconductor substrate layer 10. The conductivity type of the doped well is herein referred to as a first conductivity type, which can be p-type or n-type. The dopant concentration level of the doped well is herein referred to as a first dopant concentration level. In one embodiment, the first dopant concentration level can be in a range from $1.0 \times 10^{15}/cm^3$ to $1.0 \times 10^{18}/cm^3$, although lesser and greater dopant concentration levels can also be employed. As used herein, a dopant concentration level refers to average dopant concentration for a given region.

Peripheral devices 210 can be formed in, or on, a portion of the semiconductor substrate layer 10 located within the peripheral device region 200. The peripheral devices can include various devices employed to operate the memory devices to be formed in the device region 100, and can include, for example, driver circuits for the various components of the memory devices. The peripheral devices 210 can include, for example, field effect transistors and/or passive components such as resistors, capacitors, inductors, diodes, etc.

Optionally, a gate dielectric layer 12 can be formed above the semiconductor substrate layer 10. The gate dielectric layer 12 can be employed as the gate dielectric for a first source select gate electrode. The gate dielectric layer 12 can include, for example, silicon oxide and/or a dielectric metal oxide (such as $HfO_2$, $ZrO_2$, $LaO_2$, etc.). The thickness of the gate dielectric layer 12 can be in a range from 3 nm to 30 nm, although lesser and greater thicknesses can also be employed.

An alternating stack of first material layers (which can be insulating layers 32) and second material layers (which are referred to spacer material layers) is formed over the top surface of the substrate, which can be, for example, on the top surface of the gate dielectric layer 12. As used herein, a "material layer" refers to a layer including a material throughout the entirety thereof. As used herein, a "spacer material layer" refers to a material layer that is located between two other material layers, i.e., between an overlying material layer and an underlying material layer. The spacer material layers can be formed as electrically conductive layers, or can be replaced with electrically conductive layers in a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer 42. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the top surface of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

A lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form first memory openings 49. In other words, the transfer of the pattern in the patterned lithographic material stack through the alternating stack (32, 42) forms the first memory openings that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the gate dielectric layer 12 may be used as an etch stop layer between the alternating stack (32, 42) and the substrate. The sidewalls of the first memory openings can be substantially vertical, or can be tapered. The patterned lithographic material stack can be subsequently removed, for example, by ashing.

A memory stack structure can be formed in each of the memory opening. FIGS. 2A-2H illustrate sequential vertical cross-sectional views of a memory opening during formation of an exemplary memory stack structure. Formation of the exemplary memory stack structure can be performed within each of the memory openings 49 in the first exemplary structure illustrated in FIG. 1.

Referring to FIG. 2A, a memory opening 49 is illustrated. The memory opening 49 extends through the insulating cap layer 70, the alternating stack (32, 42), and the gate dielectric layer 12, and optionally into an upper portion of the semiconductor substrate layer 10. The recess depth of the bottom surface of each memory opening 49 with respect to the top surface of the semiconductor substrate layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 2B, an epitaxial channel portion 11 can be optionally formed at the bottom of each memory opening 49 by selective epitaxy of a semiconductor material. During the selective epitaxy process, a reactant gas and an etchant gas can be simultaneously or alternatively flowed into a process chamber. Semiconductor surfaces and dielectric surfaces of the first exemplary structure provide different nucleation rates for the semiconductor material. By setting the etch rate (determined by the flow of the etchant gas) of the semiconductor material greater than the nucleation rate of the semiconductor material on the dielectric surfaces and less than the nucleation rate of the semiconductor material on the semiconductor surfaces, the semiconductor material can grow from the physically exposed semiconductor surfaces (i.e., from the physically exposed surfaces of the semiconductor substrate layer 10 at the bottom of each memory opening 49). Each portion of the deposited semiconductor material constitutes an epitaxial channel portion 11, which comprises a single crystalline semiconductor material (e.g., single crystalline silicon) in epitaxial alignment with the single crystalline semiconductor material (e.g., single crystalline silicon) of the semiconductor substrate layer 10. Each epitaxial channel portion 11 functions as a portion of a channel of a vertical field effect transistor. The top surface of the epitaxial channel portion 11 can be between a pair of sacrificial material layers 42. In other words, a periphery of each epitaxial channel portion 11 can be in physical contact with a sidewall of an insulating layer 32. A cavity 49' is present over an epitaxial channel portion 11 in each memory opening 49.

Figure 2C:
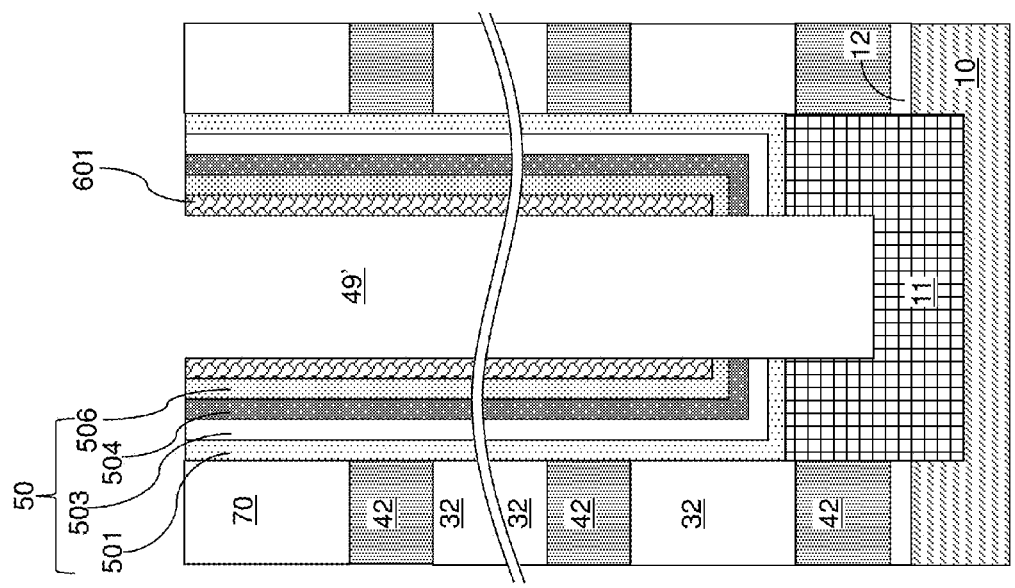

Referring to FIG. 2C, a series of layers including at least one blocking dielectric layer (501L, 503L), a continuous memory material layer 504L, a tunneling dielectric layer 506L, and an optional first semiconductor channel layer 601L can be sequentially deposited in the memory openings 49. The at least one blocking dielectric layer (501L, 503L) can include, for example, a first blocking dielectric layer 501L and a second blocking dielectric layer 503L.

In an illustrative example, the first blocking dielectric layer 501L can be deposited on the sidewalls of each memory opening 49 by a conformal deposition method. The first blocking dielectric layer 501L includes a dielectric material, which can be a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer 501L can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The first blocking dielectric layer 501L can be deposited, for example, by chemical vapor deposition (CVD), atomic layer deposition (ALD), pulsed laser deposition (PLD), liquid source misted chemical deposition, or a combination thereof. The thickness of the first blocking dielectric layer 501L can be in a range from 1 nm to 20 nm, although lesser and greater thicknesses can also be employed. The first blocking dielectric layer 501L can subsequently function as a dielectric material portion that blocks leakage of stored electrical charges to control gate electrodes. In one embodiment, the first blocking dielectric layer 501L includes aluminum oxide.

The second blocking dielectric layer 503L can be formed on the first blocking dielectric layer 501L. The second blocking dielectric layer 503L can include a dielectric material that is different from the dielectric material of the first blocking dielectric layer 501L. In one embodiment, the second blocking dielectric layer 503L can include silicon oxide, a dielectric metal oxide having a different composition than the first blocking dielectric layer 501L, silicon oxynitride, silicon nitride, or a combination thereof. In one embodiment, the second blocking dielectric layer 503L can include silicon oxide. The second blocking dielectric layer 503L can be formed by a conformal deposition method such as low pressure chemical vapor deposition, atomic layer deposition, or a combination thereof. The thickness of the second blocking dielectric layer 503L can be in a range from 1 nm to 20 nm, although lesser and greater thicknesses can also be employed. Alternatively, the first blocking dielectric layer 501L and/or the second blocking dielectric layer 503L can be omitted, and a blocking dielectric layer can be formed after formation of backside recesses on surfaces of memory films to be subsequently formed.

The continuous memory material layer 504L, the tunneling dielectric layer 506L, and the optional first semiconductor channel layer 601L can be sequentially formed. In one embodiment, the continuous memory material layer 504L can be a charge trapping material including a dielectric charge trapping material, which can be, for example, silicon nitride. Alternatively, the continuous memory material layer 504L can include a conductive material such as doped polysilicon or a metallic material that is patterned into multiple electrically isolated portions (e.g., floating gates), for example, by being formed within lateral recesses into sacrificial material layers 42. In one embodiment, the continuous memory material layer 504L includes a silicon nitride layer.

The continuous memory material layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the continuous memory material layer 504L may comprise an insulating charge trapping material, such as one or more silicon nitride segments. Alternatively, the continuous memory material layer 504L may comprise conductive nanoparticles such as metal nanoparticles, which can be, for example, ruthenium nanoparticles. The continuous memory material layer 504L can be formed, for example, by chemical vapor deposition (CVD), atomic layer deposition (ALD), physical vapor deposition (PVD), or any suitable deposition technique for storing electrical charges therein. The thickness of the continuous memory material layer 504L can be in a range from 2 nm to 20 nm, although lesser and greater thicknesses can also be employed.

The tunneling dielectric layer 506L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 506L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 506L can include a stack of a first silicon oxide layer, a silicon oxynitride layer, and a second silicon oxide layer, which is commonly known as an ONO stack. In one embodiment, the tunneling dielectric layer 506L can include a silicon oxide layer that is substantially free of carbon or a silicon oxynitride layer that is substantially free of carbon. The thickness of the tunneling dielectric layer 506L can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (501L, 503L, 504L, 506L, 601L).

Figure 2D:
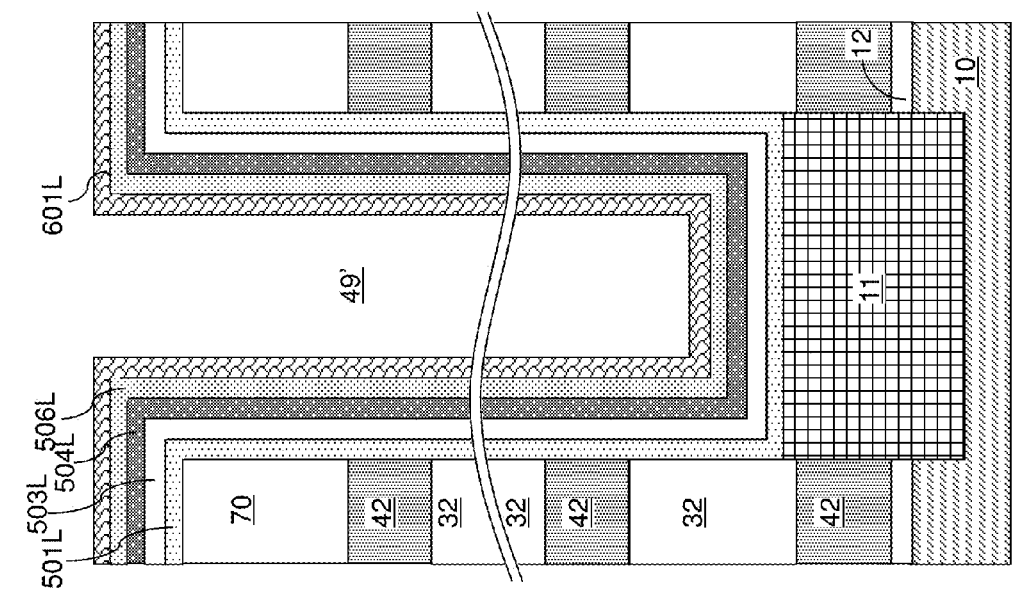

Referring to FIG. 2D, the optional first semiconductor channel layer 601L, the tunneling dielectric layer 506L, the continuous memory material layer 504L, the at least one blocking dielectric layer (501L, 503L) are sequentially anisotropically etched employing at least one anisotropic etch process. The portions of the first semiconductor channel layer 601L, the tunneling dielectric layer 506L, the continuous memory material layer 504L, and the at least one blocking dielectric layer (501L, 503L) located above the top surface of the insulating cap layer 70 can be removed by the at least one anisotropic etch process. Further, the horizontal portions of the first semiconductor channel layer 601L, the tunneling dielectric layer 506L, the continuous memory material layer 504L, and the at least one blocking dielectric layer (501L, 503L) at a bottom of each cavity 49' can be removed to form openings in remaining portions thereof. Each of the first semiconductor channel layer 601L, the tunneling dielectric layer 506L, the continuous memory material layer 504L, and the at least one blocking dielectric layer (501L, 503L) can be etched by anisotropic etch process.

Each remaining portion of the first semiconductor channel layer 601L constitutes a first semiconductor channel portion 601. Each remaining portion of the tunneling dielectric layer 506L constitutes a tunneling dielectric 506. Each remaining portion of the continuous memory material layer 504L is herein referred to as a memory material layer 504. The memory material layer 504 can comprise a charge trapping material or a floating gate material. In one embodiment, each memory material layer 504 can include a vertical stack of charge storage regions that store electrical charges upon programming. In one embodiment, the memory material layer 504 can be a charge storage layer in which each portion adjacent to the sacrificial material layers 42 constitutes a charge storage region. Each remaining portion of the second blocking dielectric layer 503L is herein referred to as a second blocking dielectric 503. Each remaining portion of the first blocking dielectric layer 501L is herein referred to as a first blocking dielectric 501.

A surface of the epitaxial channel portion 11 (or a surface of the semiconductor substrate layer 10 in case the epitaxial channel portions 11 are not employed) can be physically exposed underneath the opening through the first semiconductor channel portion 601, the tunneling dielectric 506, the memory material layer 504, and the at least one blocking dielectric (501, 503). Optionally, the physically exposed semiconductor surface at the bottom of each cavity 49' can be vertically recessed so that the recessed semiconductor surface underneath the cavity 49' is vertically offset from the topmost surface of the epitaxial channel portion 11 (or of the semiconductor substrate layer 10 in case epitaxial channel portions 11 are not employed) by a recess distance. A tunneling dielectric 506 is located over the memory material layer 504. A set of at least one blocking dielectric (501, 503), a memory material layer 504, and a tunneling dielectric 506 in a memory opening 49 constitutes a memory film 50, which includes a plurality of charge storage regions (as embodied as the memory material layer 504) that are insulated from surrounding materials by the at least one blocking dielectric (501, 503) and the tunneling dielectric 506.

In one embodiment, the first semiconductor channel portion 601, the tunneling dielectric 506, the memory material layer 504, the second blocking dielectric 503, and the first blocking dielectric 501 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Referring to FIG. 2E, a second semiconductor channel layer 602L can be deposited directly on the semiconductor surface of the epitaxial channel portion 11 or the semiconductor substrate layer 10 if portion 11 is omitted, and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Referring to FIG. 2F, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 2H:
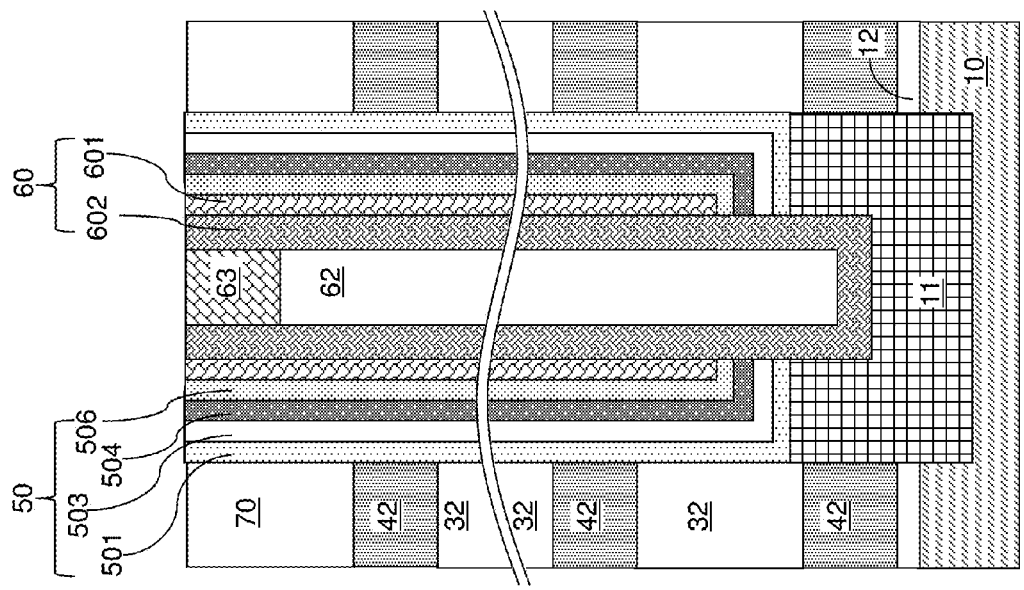
Figure 2G:
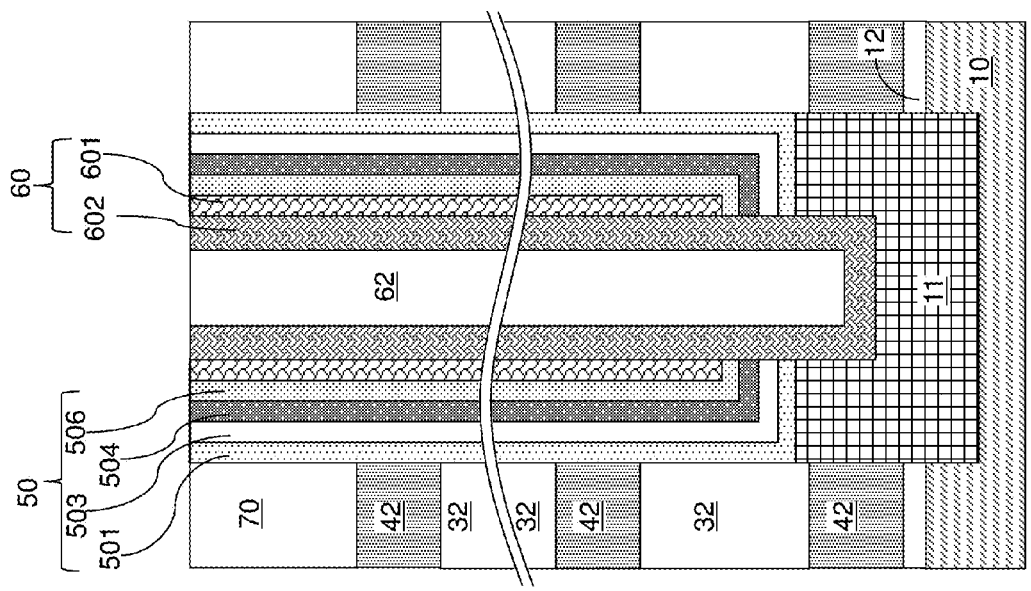

Referring to FIG. 2G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric 506 is surrounded by a memory material layer 504, and laterally surrounds a portion of the semiconductor channel 60. Each adjoining set of a first blocking dielectric 501, a second blocking dielectric 503, a memory material layer 504, and a tunneling dielectric 506 collectively constitute a memory film 50, which can store electrical charges with a macroscopic retention time. In some embodiments, a first blocking dielectric 501 and/or a second blocking dielectric 503 may not be present in the memory film 50 at this step, and a blocking dielectric may be subsequently formed after formation of backside recesses. As used herein, a macroscopic retention time refers to a retention time suitable for operation of a memory device as a permanent memory device such as a retention time in excess of 24 hours.

Referring to FIG. 2H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Figure 3:
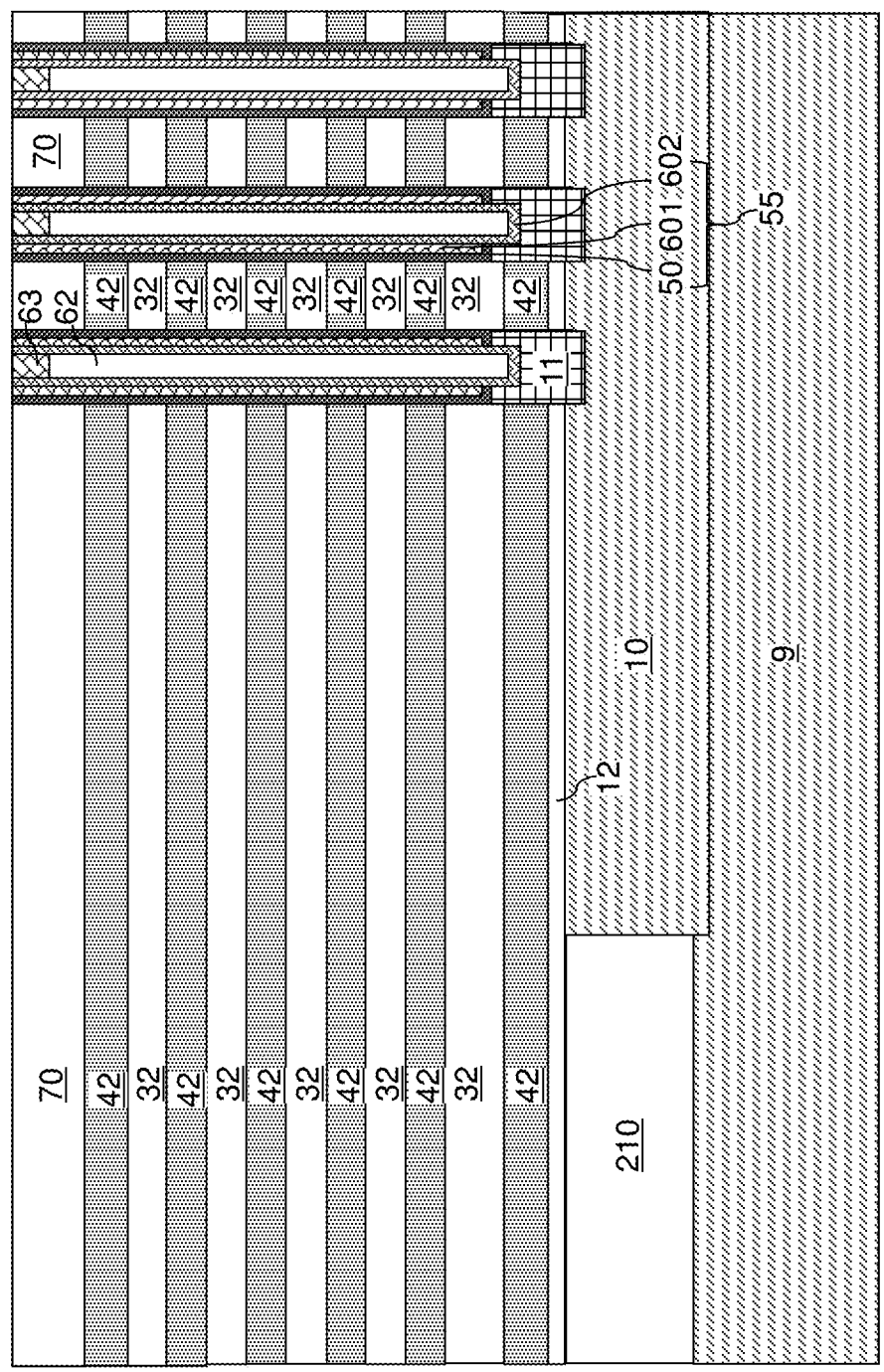
FIG. 3 is a vertical cross-sectional view of the first exemplary structure after formation of memory stack structures according to the first embodiment of the present disclosure.

The exemplary memory stack structure 55 can be embedded into the first exemplary structure illustrated in FIG. 1. FIG. 3 illustrates the first exemplary structure that incorporates multiple instances of the exemplary memory stack structure of FIG. 2H. Each exemplary memory stack structure 55 includes a semiconductor channel 60 (comprising layers 601, 602); a tunneling dielectric layer 506 laterally surrounding the semiconductor channel 60; and a vertical stack of charge storage regions laterally surrounding the tunneling dielectric layer 506 (as embodied as a memory material layer 504). The first exemplary structure includes a semiconductor device, which comprises a stack (32, 42) including an alternating plurality of material layers (e.g., the sacrificial material layers 42) and insulating layers 32 located over a semiconductor substrate (e.g., over the semiconductor substrate layer 10), and a memory opening extending through the stack (32, 42). The semiconductor device further comprises a first blocking dielectric 501 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated configuration for the memory stack structure, the methods of the present disclosure can be applied to alternative memory stack structures.

Figure 4:
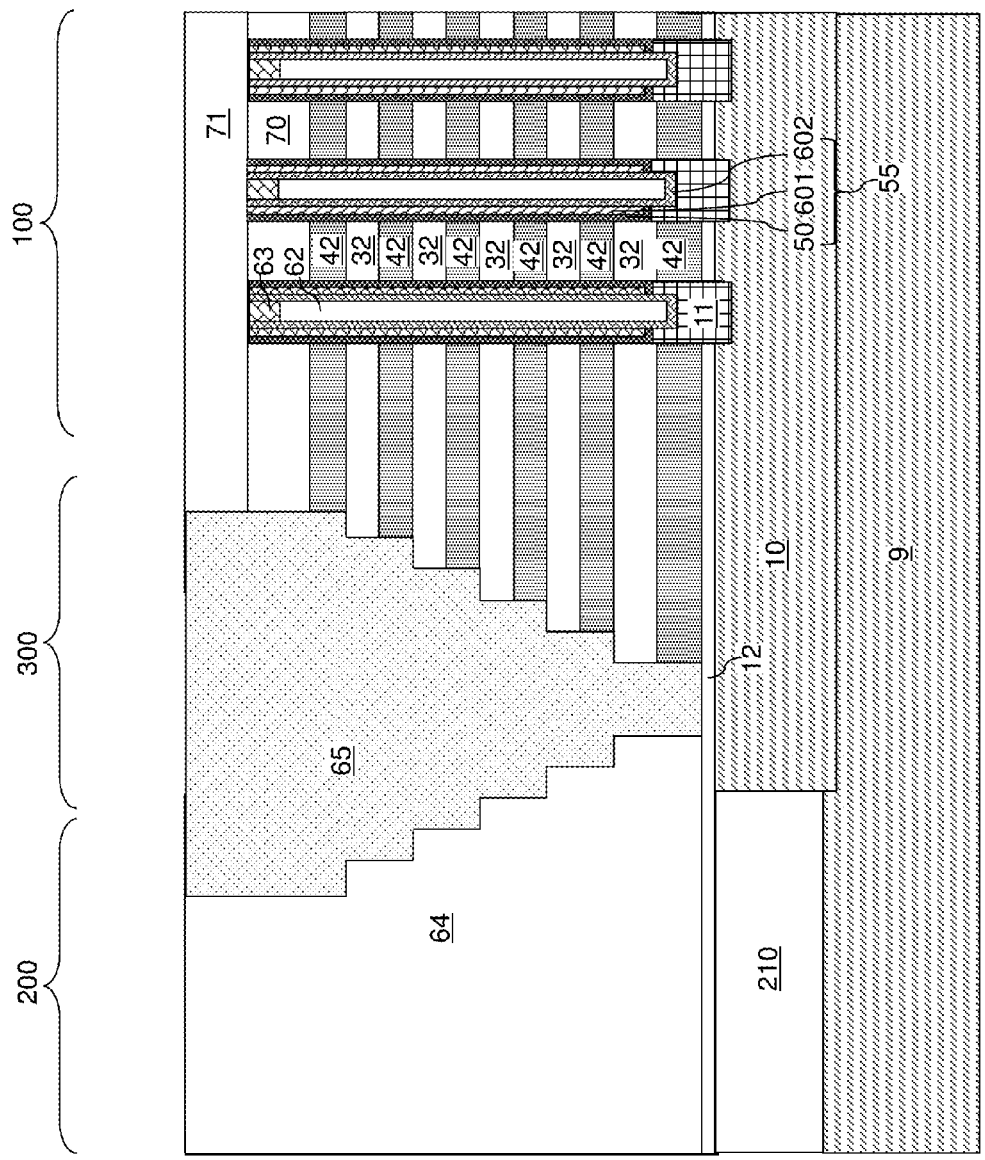
FIG. 4 is a vertical cross-sectional view of the first exemplary structure after formation of a set of stepped surfaces and a retro-stepped dielectric material portion according to the first embodiment of the present disclosure.

Referring to FIG. 4, an optional first contact level dielectric layer 71 can be formed over the semiconductor substrate layer 10. As an optional structure, the first contact level dielectric layer 71 may, or may not, be formed. In case the first contact level dielectric layer 71 is formed, the first contact level dielectric layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first contact level dielectric layer 71 can be formed over a horizontal plane including the top surface of the insulating cap layer 70 and the top surfaces of the drain regions 63. The first contact level dielectric layer 71 can be deposited by chemical vapor deposition, atomic layer deposition (ALD), spin-coating, or a combination thereof. The thickness of the first contact level dielectric layer 71 can be in a range from 10 nm to 300 nm, although lesser and greater thicknesses can also be employed.

In one embodiment, the first contact level dielectric layer 71 can be formed as a dielectric material layer having a uniform thickness throughout. The first contact level dielectric layer 71 may be formed as a single dielectric material layer, or can be formed as a stack of a plurality of dielectric material layers. Alternatively, formation of the first contact level dielectric layer 71 may be merged with formation of at least one line level dielectric layer (not shown). While the present disclosure is described employing an embodiment in which the first contact level dielectric layer 71 is a structure separate from an optional second contact level dielectric layer or at least one line level dielectric layer to be subsequently deposited, embodiments in which the first contact level dielectric layer 71 and at least one line level dielectric layer are formed at a same processing step, and/or as a same material layer, are expressly contemplated herein.

In one embodiment, the first contact level dielectric layer 71, the insulating cap layer 70, and the alternating stack (32, 42) can be removed from the peripheral device region 200, for example, by a masked etch process. In addition, a stepped cavity can be formed within the contact region 300 by patterning a portion of the alternating stack (32, 42). As used herein, a "stepped cavity" refers to a cavity having stepped surfaces. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "step" refers to a vertical shift in the height of a set of adjoined surfaces.

The stepped cavity can have various stepped surfaces such that the horizontal cross-sectional shape of the stepped cavity changes in steps as a function of the vertical distance from the top surface of the semiconductor substrate layer 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating stack is defined as the relative position of a pair of a first material layer and a second material layer within the structure. After formation of all stepped surfaces, mask material layers employed to form the stepped surfaces can be removed, for example, by ashing. Multiple photoresist layers and/or multiple etch processes can be employed to form the stepped surfaces.

A dielectric material such as silicon oxide is deposited in the stepped cavity and over the peripheral devices 210 in the peripheral device region 200. Excess portions of the deposited dielectric material can be removed from above the top surface of the first contact level dielectric layer 71, for example, by chemical mechanical planarization (CMP). The remaining portion of the deposited dielectric material filling the stepped cavity in the contact region 300 and overlying the semiconductor substrate layer 10 in the peripheral device region 200 constitutes a retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed as the dielectric material, the silicon oxide of the retro-stepped dielectric material portion 65 may, or may not, be doped with dopants such as B, P, and/or F. The top surface of the retro-stepped dielectric material portion 65 can be coplanar with the top surface of the first contact level dielectric layer 71.

The region over the peripheral devices 210 and the region over the stepped cavities can be filled simultaneously with the same dielectric material, or can be filled in different processing steps with the same dielectric material or with different dielectric materials. The cavity over the peripheral devices 210 can be filled with a dielectric material prior to, simultaneously with, or after, filling of the cavity over the stepped surface of the contact region 300 with a dielectric material. While the present disclosure is described employing an embodiment in which the cavity in the peripheral device region 200 and the stepped cavity in the contact region 300 are filled simultaneously, embodiments are expressly contemplated herein in which the cavity in the peripheral device region 200 and the stepped cavity in the contact region 300 are filled in different processing steps.

Figure 5A:
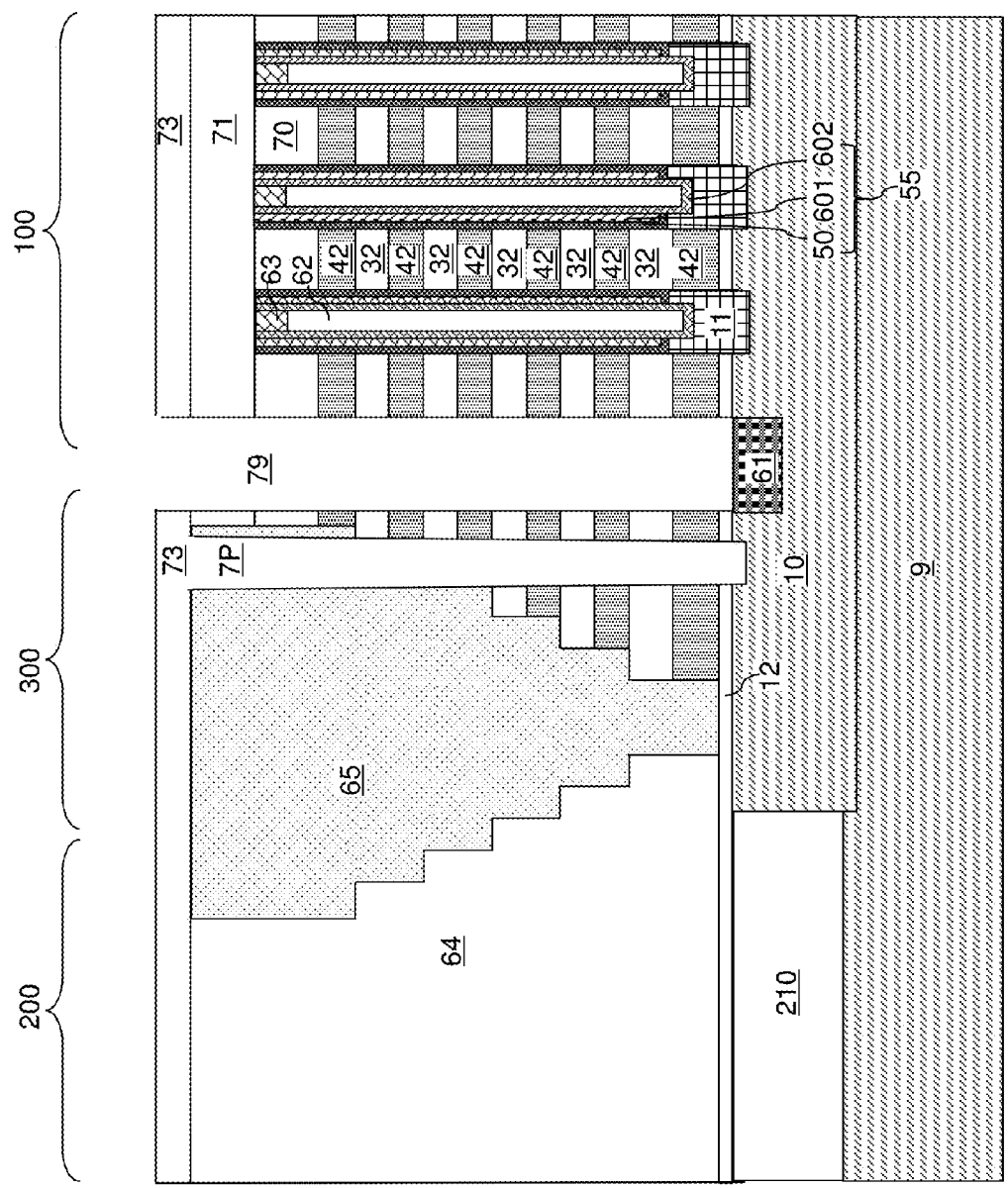
FIG. 5A is a vertical cross-sectional view of the first exemplary structure after formation of dielectric pillar structures and formation of backside trenches according to the first embodiment of the present disclosure.
Figure 5B:
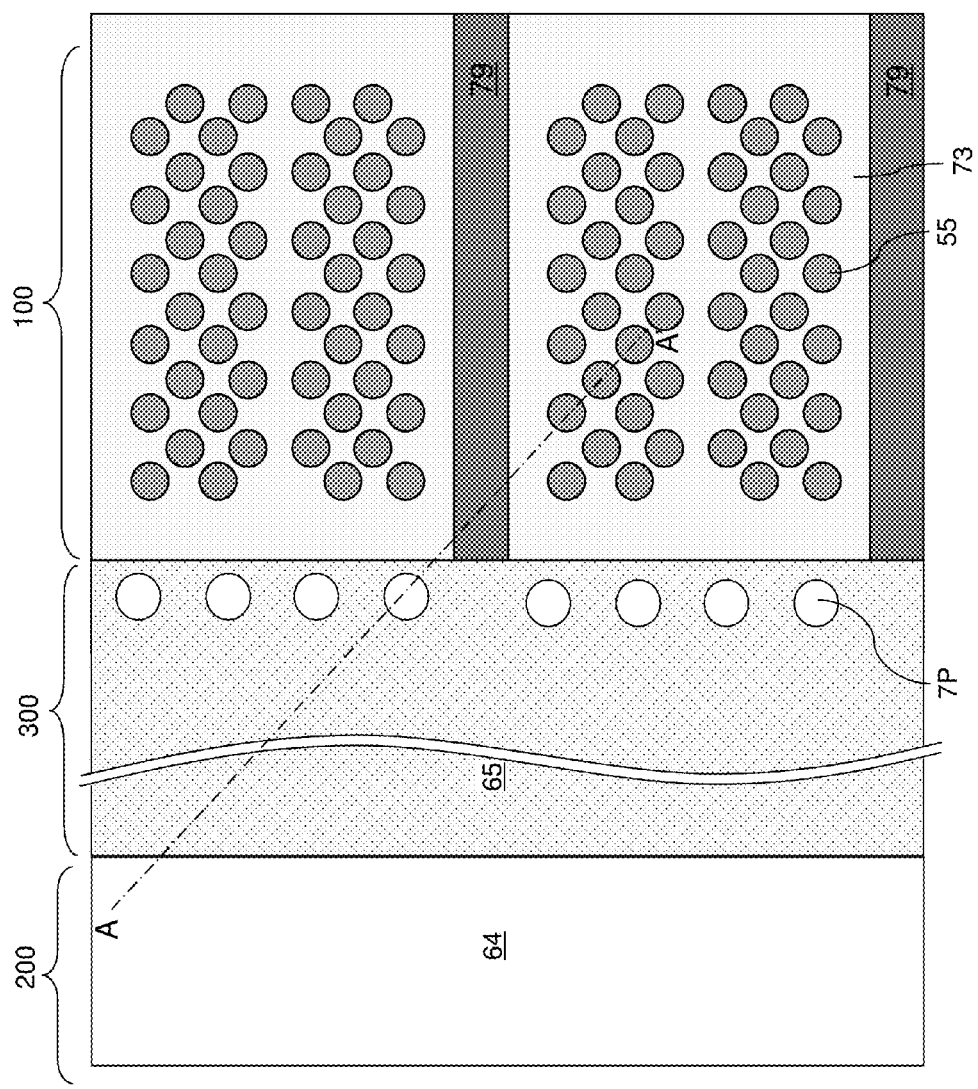
FIG. 5B is a see-through top-down view of the first exemplary structure of FIG. 5A. The vertical plane A-A' is the plane of the vertical cross-sectional view of FIG. 5A.

Referring to FIGS. 5A and 5B, dielectric support pillars 7P may be optionally formed through the retro-stepped dielectric material portion 65 and/or through the first contact level dielectric layer 71 and/or through the alternating stack (32, 42). In one embodiment, the dielectric support pillars 7P can be formed in the contact region 300, which is located adjacent to the device region 100. The dielectric support pillars 7P can be formed, for example, by forming an opening extending through the retro-stepped dielectric material portion 65 and/or through the alternating stack (32, 42) and at least to the top surface of the semiconductor substrate layer 10, and by filling the opening with a dielectric material that is resistant to the etch chemistry to be employed to remove the sacrificial material layers 42.

In one embodiment, the dielectric support pillars 7P can include silicon oxide and/or a dielectric metal oxide such as aluminum oxide. In one embodiment, the portion of the dielectric material that is deposited over the first contact level dielectric layer 71 concurrently with deposition of the dielectric support pillars 7P can be present over the first contact level dielectric layer 71 as a second contact level dielectric layer 73. Each of the dielectric support pillars 7P and the second contact level dielectric layer 73 is an optional structure. As such, the second contact level dielectric layer 73 may, or may not, be present over the insulating cap layer 70 and the retro-stepped dielectric material portion 65. The first contact level dielectric layer 71 and the second contact level dielectric layer 73 are herein collectively referred to as at least one contact level dielectric layer (71, 73). In one embodiment, the at least one contact level dielectric layer (71, 73) can include both the first and second contact level dielectric layers (71, 73), and optionally include any additional via level dielectric layer that can be subsequently formed. In another embodiment, the at least one contact level dielectric layer (71, 73) can include only the first contact level dielectric layer 71 or the second contact level dielectric layer 73, and optionally include any additional via level dielectric layer that can be subsequently formed. Alternatively, formation of the first and second contact level dielectric layers (71, 73) may be omitted, and at least one via level dielectric layer may be subsequently formed, i.e., after formation of a first source contact via structure.

The second contact level dielectric layer 73 and the dielectric support pillars 7P can be formed as a single continuous structure of integral construction, i.e., without any material interface therebetween. In another embodiment, the portion of the dielectric material that is deposited over the first contact level dielectric layer 71 concurrently with deposition of the dielectric support pillars 7P can be removed, for example, by chemical mechanical planarization or a recess etch. In this case, the second contact level dielectric layer 73 is not present, and the top surface of the first contact level dielectric layer 71 can be physically exposed.

Referring to FIGS. 5A and 5B, trenches (which are herein referred to as backside trenches 79) can be formed between each neighboring pair of clusters of the memory stack structures 55 by transferring the pattern of the openings in the photoresist layer through the at least one contact level dielectric layer (71, 73), the retro-stepped dielectric material portion 65, and the alternating stack (32, 42). Each backside trench 79 extends through the in-process alternating stack (32, 42) and to the top surface of the substrate (9, 10). A top surface of the semiconductor substrate layer 10 can be physically exposed at the bottom of each backside trench 79. In one embodiment, each backside trench 79 can extend along a first horizontal direction so that clusters of the memory stack structures 55 are laterally spaced along a second horizontal direction that is different from the first horizontal direction. Each cluster of memory stack structures 55 in conjunction with the portions of the alternating stack (32, 42) that surround the cluster constitutes a memory block. Each memory block is laterally spaced from one another by the backside trenches 79.

In one embodiment, source regions 61 can be formed in, or on, portions of the semiconductor substrate layer 10 underlying the backside trenches 79 by implantation of dopants of a second conductivity type (which is the opposite of the first conductivity type) after formation of the backside trenches 79. For example, if the first conductivity type is p-type, the second conductivity type is n-type, and vice versa.

The alternating stack of insulating layers 32 and the sacrificial material layers 42 is an in-process structure, i.e., an in-process alternating stack. The in-process alternating stack is subsequently modified by replacement of the sacrificial material layers 42 with electrically conductive layers.

Figure 6:
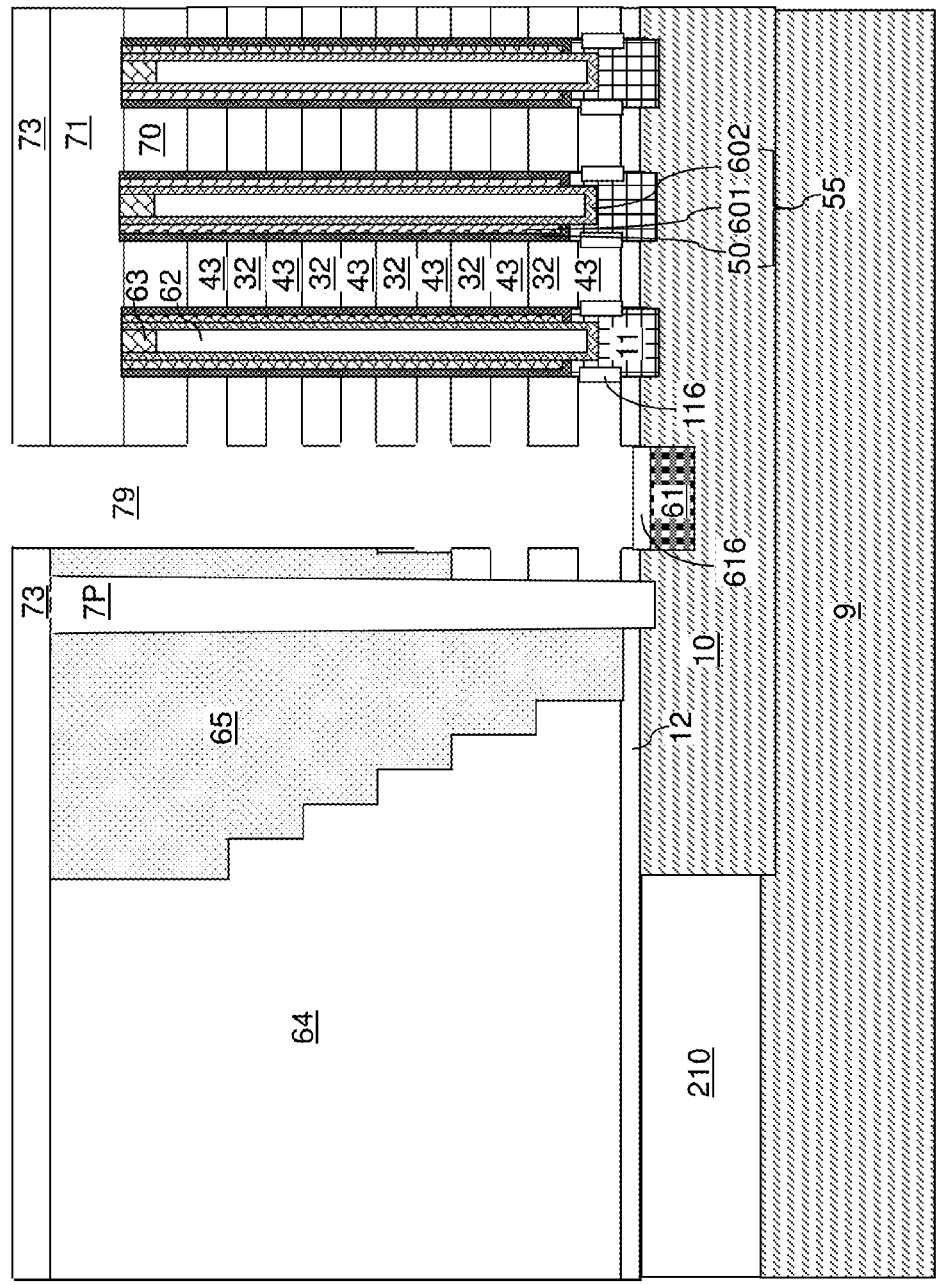
FIG. 6 is a vertical cross-sectional view of the first exemplary structure after formation of backside recesses according to the first embodiment of the present disclosure.

Referring to FIG. 6, an etchant that selectively etches the second material of the sacrificial material layers 42 with respect to the first material of the insulating layers 32 can be introduced through the backside trenches 79, for example, employing an etch process. Recesses (which are herein referred to as backside recesses 43) are formed in volumes from which the sacrificial material layers 42 are removed. The backside trenches 79 and the backside recesses 43 are formed from locations away from the memory stack structures 55, which are formed within memory openings 49 that are also referred to as front side openings.

The removal of the second material of the sacrificial material layers 42 can be selective to the first material of the insulating layers 32, the material of the dielectric support pillars 7P, the material of the retro-stepped dielectric material portion 65, the semiconductor material of the semiconductor substrate layer 10, and the material of the outermost layer of the first memory films 50. In one embodiment, the sacrificial material layers 42 can include silicon nitride, and the materials of the insulating layers 32, the dielectric support pillars 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the dielectric support pillars 7P, and the retro-stepped dielectric material portion 65 can be selected from silicon oxide, silicon nitride, and dielectric metal oxides. In this case, the depth of the backside trenches 79 can be modified so that the bottommost surface of the backside trenches 79 is located within the gate dielectric layer 12, i.e., to avoid physical exposure of the top surface of the semiconductor substrate layer 10.

The etch process that removes the second material selective to the first material and the outermost layer of the first memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid at room temperature or higher temperature, which etches silicon nitride selective to silicon oxide, silicon, and various other materials employed in the art. The dielectric support pillars 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The first memory openings in which the memory stack structures 55 are formed are herein referred to as front side openings or holes in contrast with the backside recesses 43. In one embodiment, the device region 100 comprises an array of monolithic three-dimensional NAND strings having a plurality of device levels disposed above the substrate (e.g., above the semiconductor substrate layer 10). In this case, each backside recess 43 can define a space for receiving a respective word line of the array of monolithic three-dimensional NAND strings.

Each of the plurality of backside recesses 43 can extend substantially parallel to the top surface of the semiconductor substrate layer 10. A backside recess 43 can be vertically bounded by a top surface of an underlying insulating layer 32 and a bottom surface of an overlying insulating layer 32. In one embodiment, each backside recess 43 can have a uniform height throughout. Optionally, a backside blocking dielectric layer can be formed in the backside recesses.

Subsequently, physically exposed surface portions of epitaxial channel portions 11 and the source regions 61 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert a surface portion of each source region 61 into a sacrificial dielectric portion 616. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each sacrificial dielectric portion 616 includes a dielectric material that includes the same semiconductor element as the source regions 61 and additionally includes at least one non-metallic element such as oxygen and/or nitrogen such that the material of the sacrificial dielectric portions 616 is a dielectric material. In one embodiment, the sacrificial dielectric portions 616 can include a dielectric oxide, a dielectric nitride, or a dielectric oxynitride of the semiconductor material of the source region 61.

A backside blocking dielectric layer (not shown) can be optionally formed. The backside blocking dielectric layer, if present, comprises a dielectric material that functions as a control gate dielectric for the control gates to be subsequently formed in the backside recesses 43. In case at least one blocking dielectric is present within each memory stack structure 55, the backside blocking dielectric layer is optional. In case a blocking dielectric is not present in the memory stack structures 55, the backside blocking dielectric layer is present.

Figure 7:
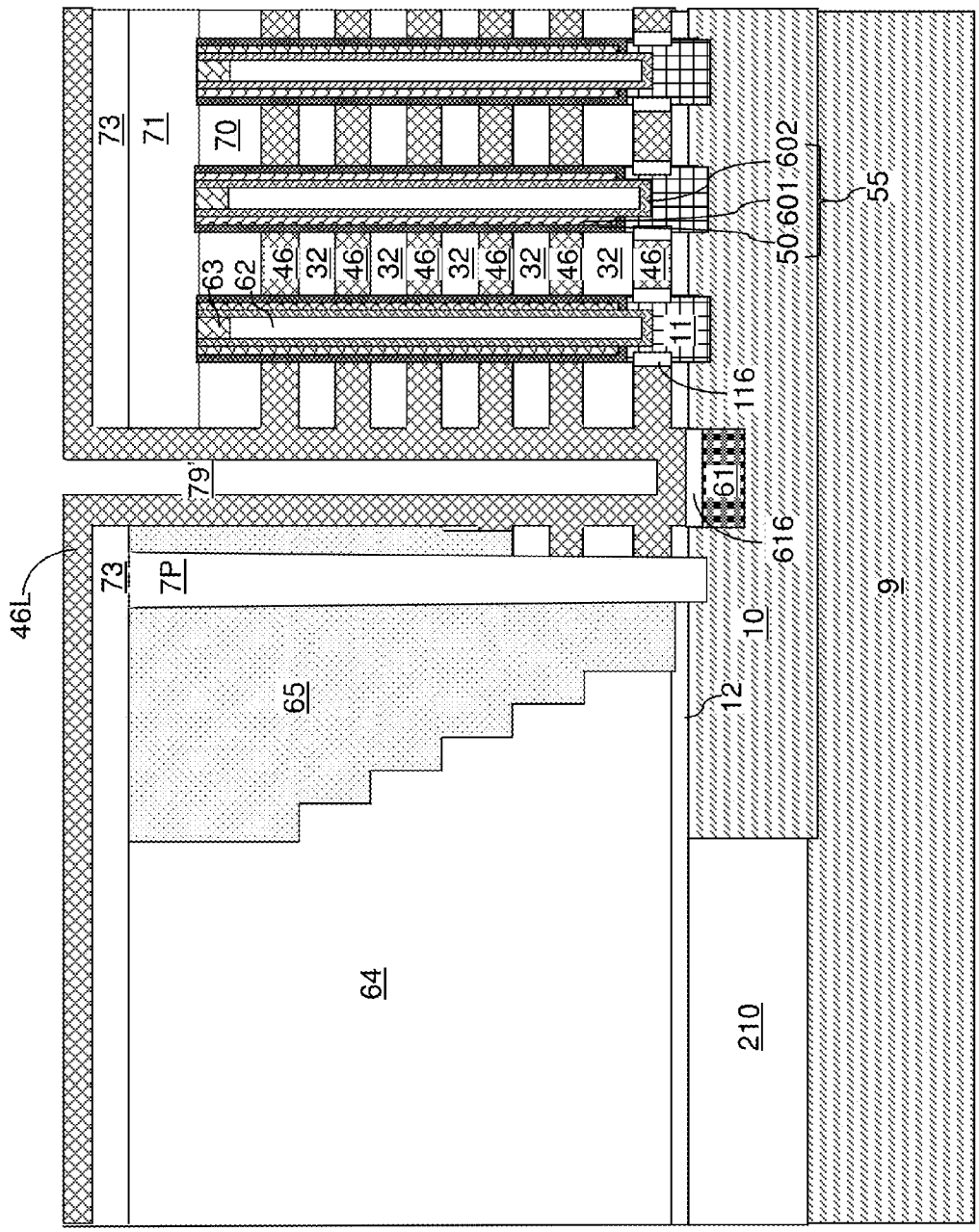
FIG. 7 is a vertical cross-sectional view of the first exemplary structure after formation of electrically conductive layers according to the first embodiment of the present disclosure.

Referring to FIG. 7, at least one metallic material can be deposited in the plurality of backside recesses 43, on the sidewalls of the at least one the backside contact trench 79, and over the top surface of the second contact level dielectric layer 73. As used herein, a metallic material refers to an electrically conductive material that includes at least one metallic element The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses 43 can be a combination of titanium nitride layer and a tungsten fill material.

In one embodiment, the metallic material can be deposited by chemical vapor deposition or atomic layer deposition. In one embodiment, the metallic material can be employing at least one fluorine-containing precursor gas as a precursor gas during the deposition process. In one embodiment, the molecule of the at least one fluorine-containing precursor gas can comprise a compound of at least one tungsten atom and at least one fluorine atom. For example, if the metallic material includes tungsten, $WF_6$ and $H_2$ can be employed during the deposition process.

A plurality of electrically conductive layers 46 can be formed in the plurality of backside recesses 43, and a continuous metallic material layer 46L can be formed on the sidewalls of each backside contact trench 79 and over the at least one contact level dielectric layer (71,73). Thus, each sacrificial material layer 42 can be replaced with an electrically conductive layer 46. A backside cavity 79' is present in the portion of each backside contact trench 79 that is not filled with the backside blocking dielectric layer and the continuous metallic material layer 46L.

Figure 8:
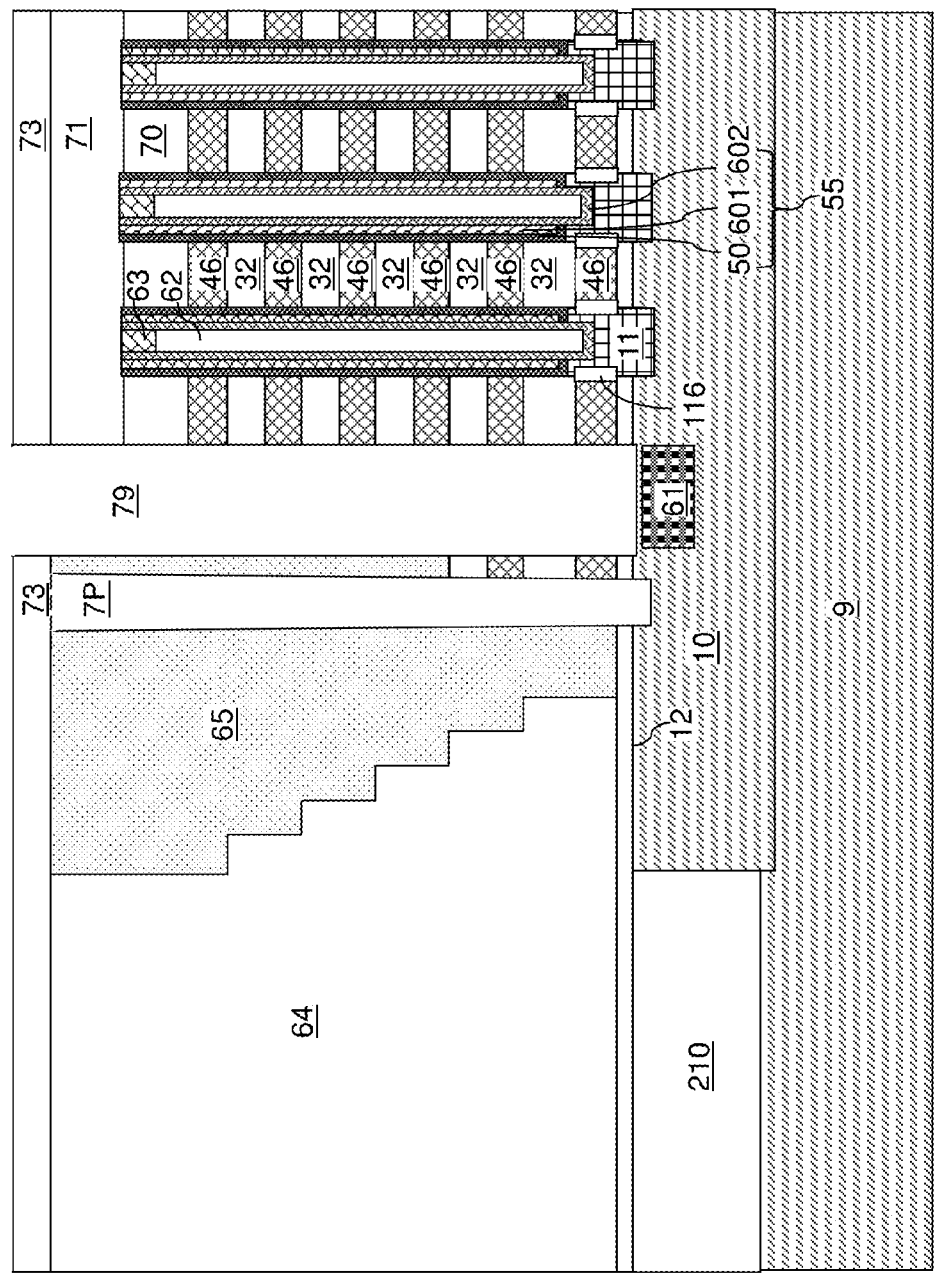
FIG. 8 is a vertical cross-sectional view of the first exemplary structure after removal of a deposited conductive material from within the backside contact trench according to the first embodiment of the present disclosure.

Referring to FIG. 8, the deposited metallic material of the continuous metallic material layer 46L is etched back from the sidewalls of each backside contact trench 79 and from above the second contact level dielectric layer 73, for example, by an isotropic etch. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. Optionally, the sacrificial dielectric portions 616 can be removed from above the source regions 61 during the last processing step of the anisotropic etch. Each backside trench 79 extends through the alternating stack (32, 46) of the insulating layers 32 and the electrically conductive layers 46 and to the top surface of the substrate (9, 10).

Figure 9:
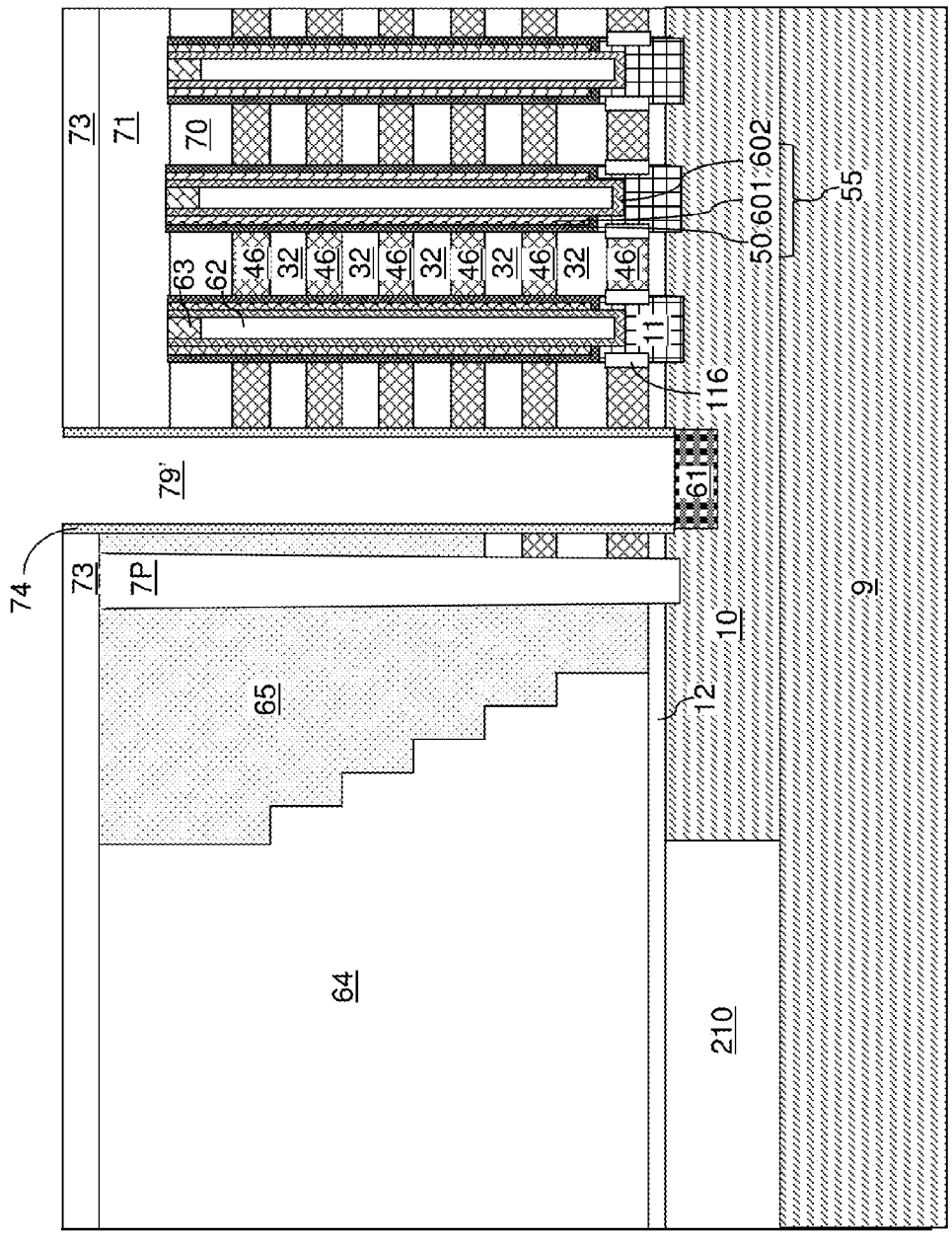
FIG. 9 is a vertical cross-sectional view of the first exemplary structure after formation of an insulating spacer according to the first embodiment of the present disclosure.

Referring to FIG. 9, an insulating material layer can be formed in each backside contact trench 79 and over the second contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. The thickness of the insulating material layer can be in a range from 1.5 nm to 60 nm, although lesser and greater thicknesses can also be employed.

Subsequently, an anisotropic etch is performed to remove horizontal portions of the insulating material layer and to optionally remove the horizontal portion of the backside blocking dielectric layer from above the second contact level dielectric layer 73. Each remaining portion of the insulating material layer inside a backside contact trench 79 constitutes a vertically elongated annular structure with a vertical cavity therethrough, which is herein referred to as an insulating spacer 74. In one embodiment, an annular bottom surface of the insulating spacer 74 contacts a top surface of the source region 61.

Each insulating spacer 74 can be formed over the sidewalls of the backside contact trench 79, and directly on the sidewalls of the electrically conductive layers 46, i.e., directly on the sidewalls of the metallic material portions 46. The thickness of each insulating spacer 74, as measured at a bottom portion thereof, can be in a range from 1.5 nm to 60 nm, although lesser and greater thicknesses can also be employed. In one embodiment, the thickness of the insulating spacer 74 can be in a range from 3 nm to 10 nm. Each insulating spacer 74 laterally surrounds a cavity, which is herein referred to as a backside cavity 79'. A top surface of a source region 61 (which is a doped semiconductor material portion) can be physically exposed at the bottom of each backside cavity 79' that is provided within an insulating spacer 74.

Figure 10:
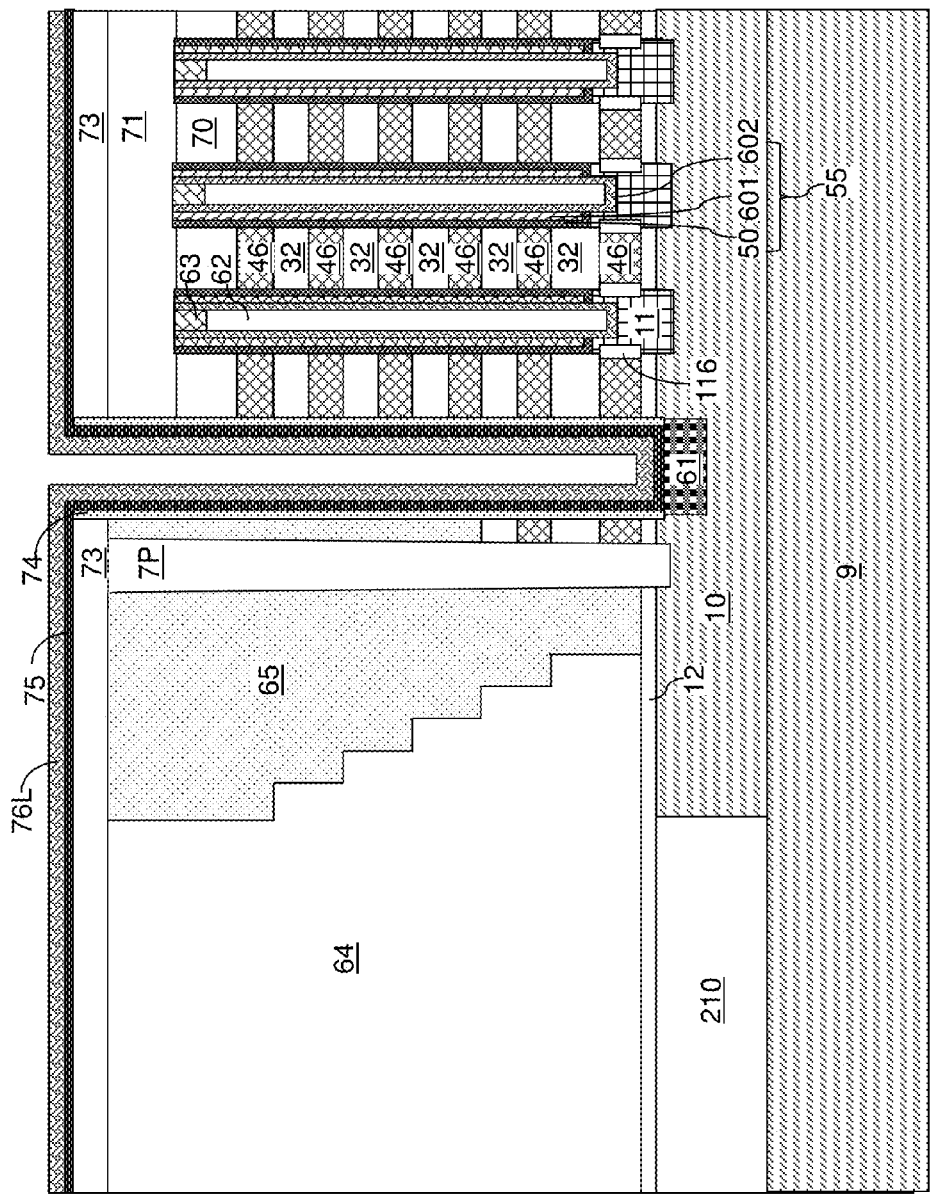
FIG. 10 is a vertical cross-sectional view of the first exemplary structure after deposition of a diffusion barrier layer and an aluminum layer according to the first embodiment of the present disclosure.

Referring to FIG. 10, an electrically conductive diffusion barrier layer 75 can be formed on the inner sidewalls of each insulating spacer 74, on the physically exposed surfaces of the source regions 61, and over the contact level dielectric layers (71, 73). The diffusion barrier layer 75 may be a metallic diffusion barrier layer. As used herein, a "metallic diffusion barrier material" refers to a conductive metal layer or an electrically conductive compound of at least one elemental metal and at least one non-metallic element that is effective in blocking diffusion of metal therethrough. Exemplary metallic diffusion barrier materials include refractory metals (such as Ti and W), metallic nitrides (such as TiN, TaN, and WN) and metallic carbides (such as TiC, TaC, and WC). The diffusion barrier layer 75 does not diffuse into underlying semiconductor materials, and prevents diffusion of metallic materials to be subsequently deposited in the backside trenches 79 into the substrate (9, 10). The diffusion barrier layer 75 may be deposited by a conformal deposition method such as chemical vapor deposition (CVD), or may be deposited by a non-conformal deposition method such as physical vapor deposition (PVD). The thickness of the diffusion barrier layer 75, as measured at a horizontal portion contacting a source region 61, can be in a range from 2 nm to 30 nm, although lesser and greater thicknesses can also be employed. For example, the diffusion barrier 75 may include a 20 nm thick Ti layer and a 5 nm thick TiN layer. In one embodiment, the diffusion barrier layer 75 material may be selected to have an opposite stress type to the aluminum layer 76L described below to avoid or reduce warping the substrate. For example, if the aluminum layer 76L is in tensile stress, then the barrier layer 75 may be in compressive stress.

An aluminum layer 76L can be deposited on the diffusion barrier layer 75. The aluminum layer 76L includes an aluminum-containing material, which can be aluminum or an aluminum-containing metallic alloy in which aluminum is the predominant element, i.e., an aluminum-containing metallic alloy in which aluminum atoms accounts for more than 50 wt. % (such as more than 90 wt. %, such as 97-99 wt. %) of all atoms in the alloy. In one embodiment, the aluminum layer 76 can include substantially pure aluminum and unavoidable impurities, i.e., a material consisting essentially of aluminum. If an aluminum alloy is employed for the aluminum layer 76L, non-aluminum metal elements in the aluminum alloy can include, for example, copper, nickel and/or cobalt (e.g., 2 wt. % Cu or Co and remainder Al). In one embodiment, the aluminum layer 76L can be deposited as an amorphous or small grain polycrystalline material layer. For example, the aluminum layer 76L can be deposited as an amorphous aluminum layer consisting essentially of amorphous aluminum.

In one embodiment, the aluminum layer 76L can be deposited as a conformal aluminum layer by a metal organic chemical vapor deposition employing an organoaluminum compound such as triisobutylaluminum (TIBAL), dimethyl aluminum hydride or trimethylaluminum (TMA). A conformal deposition process such as atomic layer deposition (ALD) or chemical vapor deposition (CVD) can be employed to deposit the aluminum layer 76L. In an illustrative example, the aluminum layer 76L can be deposited employing an ALD process in which trimethylaluminum (which is the reactant gas) and hydrogen plasma (which reduces the reactant molecules adsorbed on surfaces) are alternately provided in a process chamber including the first exemplary structure. The aluminum layer 76L deposited by such a conformal deposition method can provide smooth surface morphology (with root mean square surface roughness less than 0.2 nm) and good step coverage even in high aspect ratio cavities. The thickness of the aluminum layer 76L, as measured on a sidewall of the diffusion barrier layer 75, can be less than one half of the minimum lateral dimension between opposing inner sidewalls of the diffusion barrier layer 75 within a backside trench 79. In this case, a vertically-extending cavity that is not filled within the aluminum layer 75 can be present within each backside trench 79.

Figure 11:
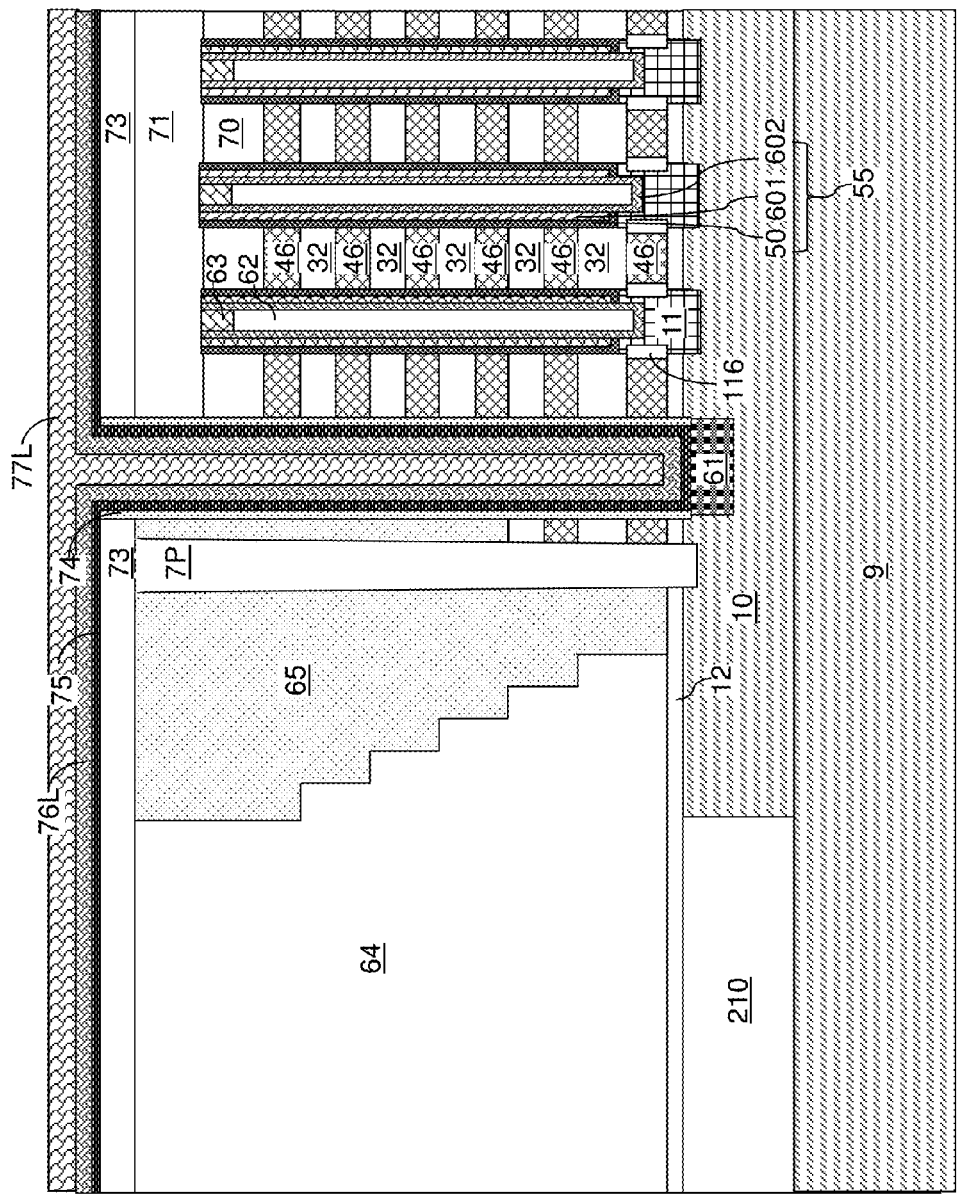
FIG. 11 is a vertical cross-sectional view of the first exemplary structure after deposition of a semiconductor material layer according to the first embodiment of the present disclosure.

Referring to FIG. 11, a non-metallic material is deposited in each cavity surrounded by vertical portions of the aluminum layer 75L and over the contact level dielectric layers (71, 73). The non-metallic material fills each cavity in the backside trenches 79. In one embodiment, the non-metallic material includes a semiconductor material. A semiconductor material layer 77L that continuously extends over the entire surface of the contact level dielectric layers (71, 73) and over the backside trenches 79 is thus formed. The semiconductor material layer 77L can include a Group IV semiconductor material or a III-V compound semiconductor material. In an illustrative example, the semiconductor material layer 77L can include silicon or a silicon-germanium alloy. The semiconductor material layer 77L may, or may not, be doped with electrical dopants, which can be p-type dopants or n-type dopants. In one embodiment, the semiconductor material layer 77L can be in-situ doped to provide low resistivity to the deposited semiconductor material. The semiconductor material layer 77L can include a conductive material if the dopant concentration therein is sufficiently high. In an illustrative example, the semiconductor material layer 77L can include doped amorphous silicon or doped small grain polysilicon. The semiconductor material layer 77L can be deposited by a conformal deposition method such as chemical vapor deposition (CVD) or atomic layer deposition (ALD). In one embodiment, a planarization process is performed to remove portions of the aluminum layer 76L, the semiconductor material layer 77L, and the diffusion barrier layer 75 from above a horizontal plane including the top surface of the contact level dielectric layer (71, 73). In another embodiment, the planarization is carried out after the anneal and crystallization, as will be described below with respect to FIG. 13.

Figure 12:
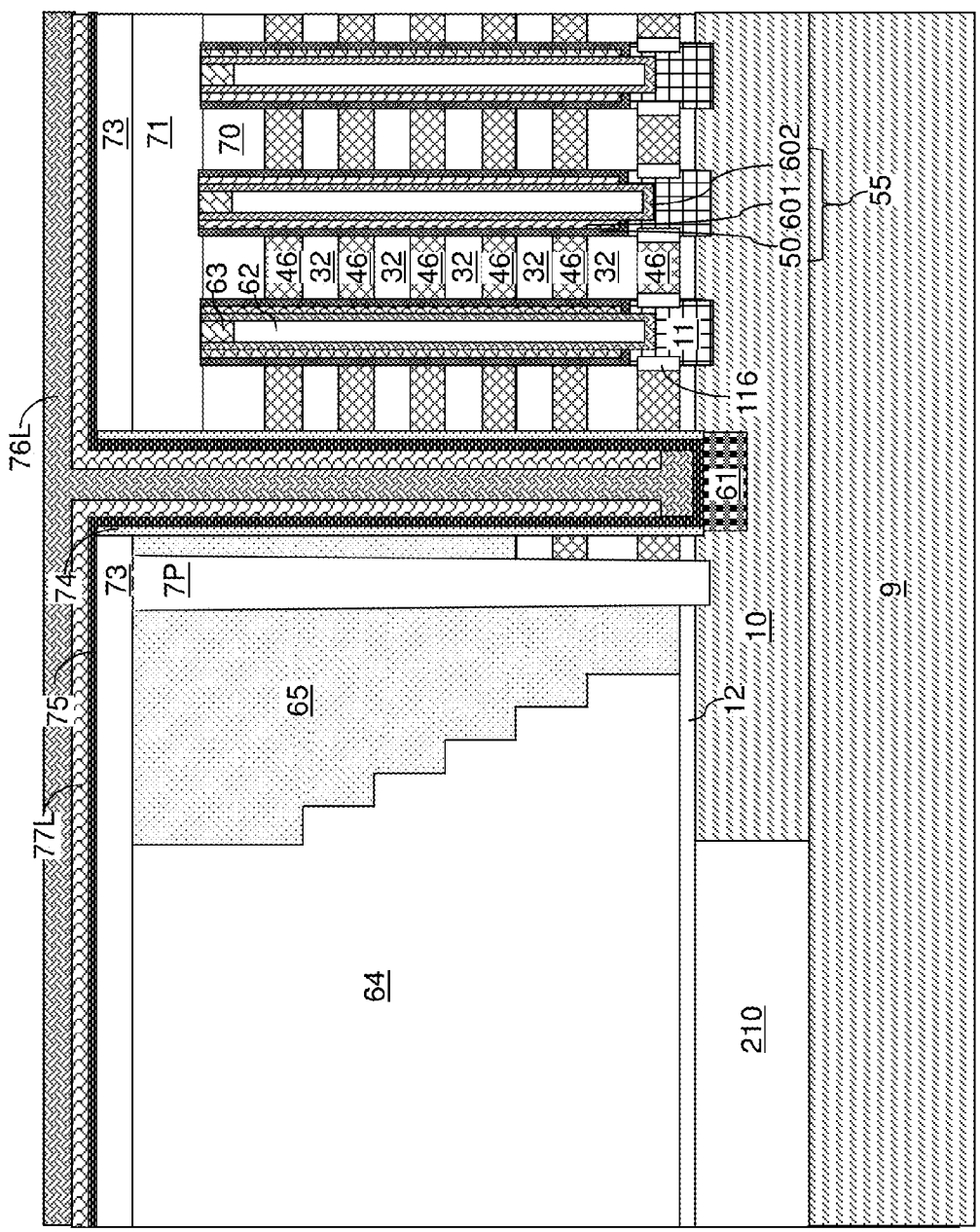
FIG. 12 is a vertical cross-sectional view of the first exemplary structure after an anneal process that induces layer crystallization and migration of aluminum according to the first embodiment of the present disclosure.

Referring to FIG. 12, an anneal process (which is herein referred to as a crystallization anneal) is performed to induce crystallization of the deposited semiconductor material. The anneal process can be performed at an elevated temperature in a range from 400 degrees Celsius to 725 degrees Celsius (such as from 625 degrees Celsius to 700 degrees Celsius). In case the semiconductor material layer 77L is deposited as an amorphous or small grain polycrystalline semiconductor material layer, the semiconductor material of the semiconductor material layer 77L can be crystallized to form a large grain polycrystalline or single crystalline semiconductor material. For example, if the semiconductor material layer 77L is deposited as a doped or undoped silicon layer, the crystallization anneal can convert the amorphous silicon layer into a large grain polysilicon or single crystal silicon layer.

In one embodiment layer 77L comprises amorphous silicon or polysilicon, and the crystallization process comprises a metal induced crystallization ("MIC") process. In the MIC process, aluminum from layer 76L aids crystallization of the silicon layer 77L during the annealing. Specifically, without wishing to be bound by a particular theory, it is believed that at elevated temperature, silicon atoms move relatively freely into and through the aluminum layer. Dissolved silicon starts crystallizing since free energy of amorphous silicon is high as compared to crystalline silicon, as the system tends to go into a state with lower free energy. During the crystallization process within the aluminum layer, the aluminum atoms are rejected from the crystalline phase due to very low solid solubility of aluminum in silicon. As a result, the aluminum atoms diffuse out of leaving behind crystalline silicon. As this process continues, the separation of crystalline silicon and aluminum layers occurs, and the two layers exchange places. The aluminum leaves behind a single crystal silicon or large grain polysilicon material in the region through which the aluminum is diffused. If the aluminum layer 76L is relatively thin, then substantially all of the aluminum from layer 76L may exchange places with the silicon layer 77L to be located in the middle of the trench 79 during the MIC process. In this case, the silicon layer 77L and the aluminum layer 76L switch positions in the trench 79 during the MIC process. After aluminum layer and semiconductor layer exchange process, aluminum layer 76L is located in the middle of the trench 79. The recrystallized single crystal silicon or polysilicon layer 77L is located between the diffusion barrier layer 75 and the aluminum layer 76L in the trench 79. The silicon layer 77L is located on both lateral (i.e., vertical) sidewalls of the aluminum layer 76L. In this embodiment, the recrystallized silicon layer 77L and the diffusion barrier layer 75 encapsulate the aluminum layer 76L on both sides. The encapsulation reduces or prevents aluminum migration voids from occurring in the aluminum layer 76L during subsequent high temperature process steps during device manufacture. If the subsequent process steps are conducted at the same or lower temperature as the MIC anneal, then the subsequent process steps should not cause the aluminum layer 76L to flow and thus should not cause voids in the aluminum layer 76L. Furthermore, the recrystallized silicon layer 77L formed during the MIC process may have a higher conductivity than the initial amorphous silicon or small grain polysilicon. Some of the aluminum that diffuses through the silicon may remain in the silicon layer 77L such that the silicon layer 77L becomes an aluminum doped silicon layer, which further increases its conductivity.

If the planarization process is not carried out prior to the annealing, then a horizontal portion of the deposited semiconductor material (as embodied as the semiconductor material layer 77L) overlies a horizontal portion of the deposited aluminum located above the alternating stack (i.e., the horizontal portion of the aluminum layer 76L overlying the alternating stack) prior to the anneal process. The horizontal portion of the deposited aluminum can exchange places with the horizontal portion of the deposited semiconductor material during the anneal process. The anneal process can induce crystallization of the semiconductor material.

Figure 13:
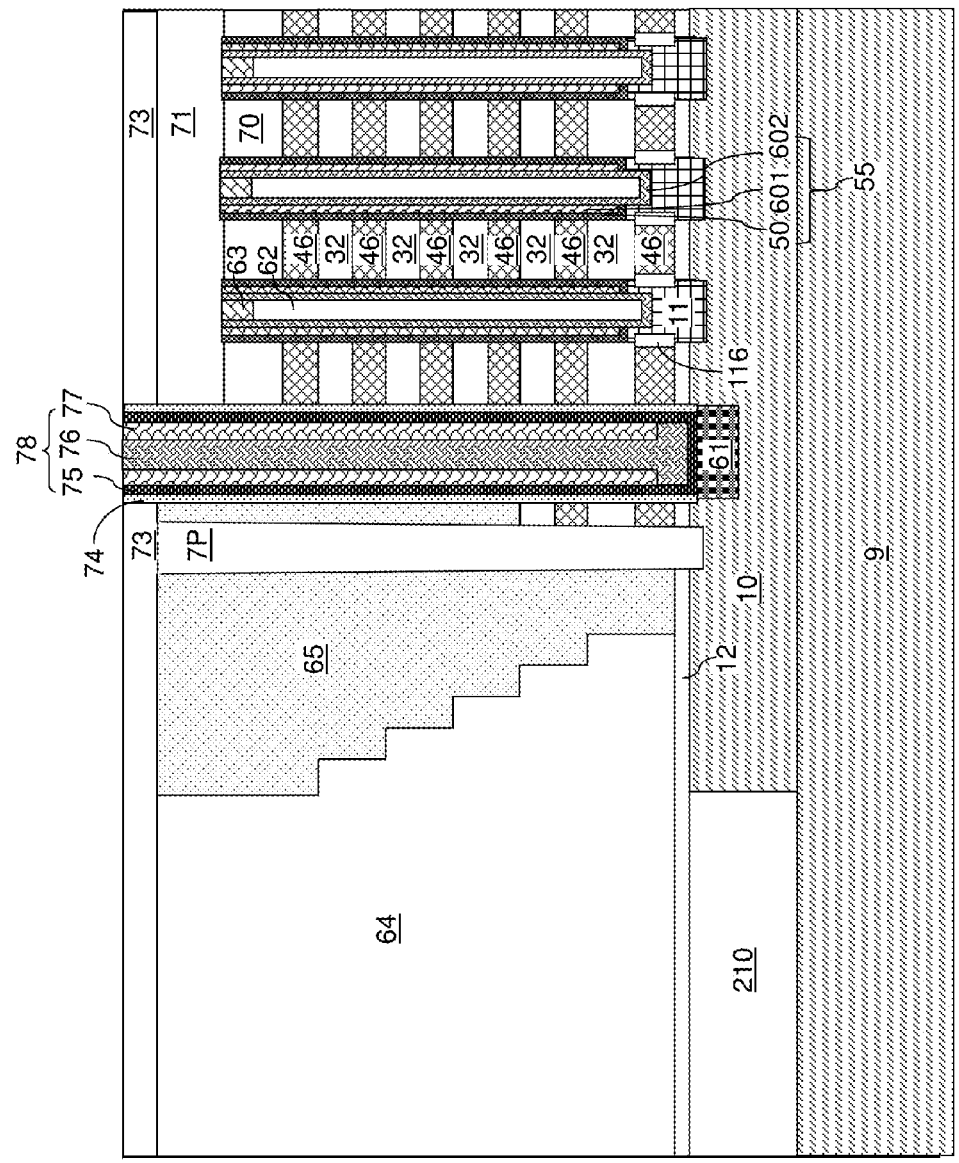
FIG. 13 is a vertical cross-sectional view of the first exemplary structure after a planarization process that forms a contact via structure according to the first embodiment of the present disclosure.

Referring to FIG. 13, a planarization process is performed to remove portions of the aluminum layer 76L, the semiconductor material layer 75L, and the diffusion barrier layer 75 from above a horizontal plane including the top surface of the contact level dielectric layer (71, 73). A horizontal portion of aluminum (as embodied in the horizontal portion of the aluminum layer 76L), a horizontal portion of the semiconductor material (as embodied in the horizontal portion of the polycrystalline semiconductor material layer 77L), and a horizontal portion of the diffusion barrier layer 75 can be sequentially removed from above the alternating stack (32, 46) in that order. Removal of the various material portions of the aluminum layer 76L, the semiconductor material layer 77L, and the diffusion barrier layer 75 can be performed employing at least one recess etch (which may be an anisotropic etch or an isotropic etch) and/or chemical mechanical planarization (CMP). In one embodiment, a series of reactive ion etch processes can be performed to remove the entire horizontal portions of the layer stack including the aluminum layer 76L, the semiconductor material layer 77L, and the diffusion barrier layer 75, or a subset thereof. If horizontal portions of the layer stack are not completely removed from above the top surface of the contact level dielectric layer (71, 73), a CMP process can be employed to complete the planarization process.

Each backside trench 79 includes a dielectric spacer 74, a remaining portion of the diffusion barrier layer 75, a remaining portion of the semiconductor material layer 77L which is herein referred to as a semiconductor material portion 77 (e.g., a silicon portion), and a remaining portion of the aluminum layer 76L which is herein referred to as an aluminum portion 76. The semiconductor material portion 77 is a non-metallic material portion, i.e., a portion that includes a material other than a metallic material. The diffusion barrier layer 75 is laterally surrounded by, and contacted by, the insulating spacer 74. Thus, the aluminum portion 76 is located in the middle of the trench 79, the silicon portion 77 surrounds and encapsulates the aluminum portion 76 on both vertical sides of portion 76. The diffusion barrier layer 75 surrounds the silicon portion 77. Within each backside trench 79, the cavity 79' that is present immediately after formation of the diffusion barrier layer 75 in one of the processing steps of FIG. 10 can be filled with a combination of an aluminum portion 76 and a non-metallic material portion as embodied in a semiconductor material portion 77. The combination of the aluminum portion 76 and the semiconductor material portion 77 and a portion of the diffusion barrier layer 75 constitute a contact via structure 78 (which is a source contact via structure). The contact via structure 78 extends through the alternating stack (32, 46) and contacts a top surface of a doped semiconductor portion (i.e., a source region 61) embedded in the substrate (9, 10).

Figure 14:
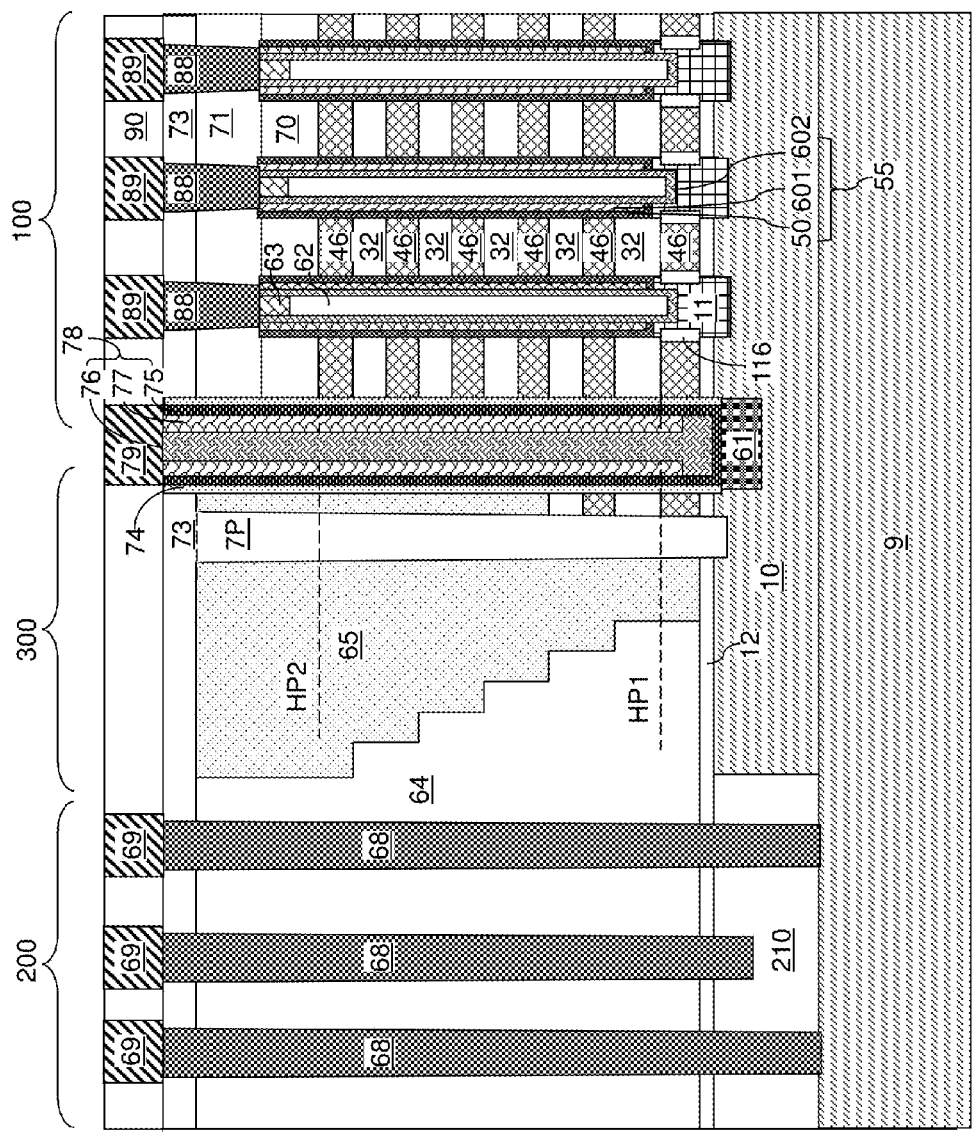
FIG. 14 is a vertical cross-sectional view of the first exemplary structure after formation of additional contact via structures and metal lines according to the first embodiment of the present disclosure.

Referring to FIG. 14, a photoresist layer (not shown) can be applied over the topmost layer of the first exemplary structure (which can be, for example, the second contact level dielectric layer 73), and can be lithographically patterned to form various openings in the device region 100, the peripheral device region 200, and the contact region 300. The locations and the shapes of the various openings are selected to correspond to electrical nodes of the various devices to be electrically contacted by contact via structures. In one embodiment, a single photoresist layer may be employed to pattern all openings that correspond to the contact via cavities to be formed, and all contact via cavities can be simultaneously formed by at least one anisotropic etch process that employs the patterned photoresist layer as an etch mask. In another embodiment, a plurality of photoresist layers may be employed in combination with a plurality of anisotropic etch processes to form different sets of contact via cavities with different patterns of openings in the photoresist layers. The photoresist layer(s) can be removed after a respective anisotropic etch process that transfers the pattern of the openings in the respective photoresist layer through the underlying dielectric material layers and to a top surface of a respective electrically conductive structure.

In an illustrative example, drain contact via cavities can be formed over each memory stack structure 55 in the device region 100 such that a top surface of a drain region 63 is physically exposed at the bottom of each drain contact via cavity. Word line contact via cavities can be formed to the stepped surfaces of the alternating stack (32, 46) such that a top surface of an electrically conductive layer 46 is physically exposed at the bottom of each word line contact via cavity in the contact region 300. A device contact via cavity can be formed to each electrical node of the peripheral devices 210 to be contacted by a contact via structure in the peripheral device region.

The various via cavities can be filled with at least one conductive material, which can be a combination of an electrically conductive metallic liner material (such as TiN, TaN, or WN) and a metallic fill material (such as W, Cu, or Al). Excess portions of the at least one conductive material can be removed from above the at least one contact level dielectric layer (71, 73) by a planarization process, which can include, for example, chemical mechanical planarization (CMP) and/or a recess etch. Drain contact via structures 88 can be formed on the respective drain regions 63. Word line contact via structures (not shown) can be formed on the respective electrically conductive layers 46. Peripheral device contact via structures 68 can be formed on the respective nodes of the peripheral devices.

A line level dielectric layer 90 can be formed over the at least one contact level dielectric layer (71, 73), and can be patterned to form line level cavities. The line level cavities can be filled with at least one conductive material to provide various metal lines, which can include, for example, a source line 79 that contacts the contact via structure 78, bit lines 89 that contact the drain contact via structures 88, and peripheral device lines 69 that contact peripheral device contact structures 68. Additional metal interconnect structures (not shown) and interlayer dielectric material layers (not) shown can be formed over the first exemplary structure to provide additional electrical wiring.

The first exemplary structure includes an alternating stack of insulating layers 32 and electrically conductive layers 46 located over a substrate (9, 10), and a contact via structure 78 extending through the alternating stack (32, 46), contacting a top surface of a doped semiconductor portion (i.e., a source region 61) embedded in the substrate (9, 10). The via structure 78 includes a diffusion barrier layer 75 comprising a conductive metallic compound of at least one elemental metal and at least one non-metallic element, and a combination of an aluminum portion 76 and a non-metallic material portion 77. The combination (76, 77) is laterally surrounded by the diffusion barrier layer 75.

In one embodiment, the non-metallic material portion comprises a semiconductor material portion 77. The semiconductor material portion 77 can laterally surround the aluminum portion 76. An outer sidewall of the semiconductor material portion 77 can contact an inner sidewall of the diffusion barrier layer 75, and an inner sidewall of the semiconductor material portion 77 can contact an outer sidewall of the aluminum portion 76. A bottom surface of the aluminum portion 76 can be located above, and can be vertically spaced from, a top surface of a horizontal portion of the diffusion barrier layer 75 that contacts the source region 61 underneath.

In one embodiment shown in FIG. 14, each of the aluminum portion 76 and the non-metallic material portion (i.e., the semiconductor material portion 77) can extend from a first horizontal plane HP1 including a top surface of a bottommost layer within the alternating stack (32, 46) to a second horizontal plane HP2 including a top surface of the topmost layer within the alternating stack (32, 46). In one embodiment, a horizontal portion of the diffusion barrier layer 75 can contact the top surface of the doped semiconductor portion (i.e., the source region 61) embedded in the substrate (9, 10) and a bottom surface of the aluminum portion 76. The non-metallic portion (i.e., the semiconductor material portion 77) can be vertically spaced from the horizontal portion of the diffusion barrier layer 75 by the aluminum portion 76.

In one embodiment, a metal line 79 (e.g., source line) can contact a top surface of the aluminum portion 76 and a top surface of the non-metallic material portion (as embodied as the semiconductor material portion 77). In one embodiment, an insulating spacer 74 laterally surrounds the contact via structure 78 and electrically isolates the contact via structure 78 from the electrically conductive layers 46 (e.g., word lines).

In one embodiment, at least one memory stack structure 55 extending through the alternating stack (32, 46) is provided. Each of the at least one memory stack structure 55 includes, from inside to outside, a semiconductor channel 60, a tunneling dielectric layer 506 laterally surrounding the semiconductor channel 60. A vertical stack of charge storage regions (as embodied as portions of the memory material layer 504 at each level of the conductive material layers 46 and vertically spaced by portions of the memory material layer 504 at each level of the insulating layers 32) laterally surrounds the tunneling dielectric layer 506.

In one embodiment, the structure comprises a three-dimensional memory device that comprises a vertical NAND device formed in a device region 100. The electrically conductive layers 46 can comprise, or can be electrically connected to, a respective word line of the NAND device as embodied as portions of the electrically conductive layers 46. The device region 100 can include a plurality of semiconductor channels 60, wherein at least one end portion of each of the plurality of semiconductor channels 60 extends substantially perpendicular to a top surface of the substrate (9, 10), a plurality of charge storage regions as embodied as discrete portions of the memory material layer 504 that are located adjacent to the electrically conductive layers, and a plurality of control gate electrodes having a strip shape extending substantially parallel to the top surface of the substrate (9, 10). Each charge storage region is located adjacent to a respective one of the plurality of semiconductor channels 60. Each of the control gate electrodes comprises a portion of a respective electrically conductive layer 46 that is proximal to the memory material layer 504. In one embodiment, the plurality of control gate electrodes comprise at least a first control gate electrode located in a first device level and a second control gate electrode located in a second device level. The electrically conductive layers in the stack can be in electrical contact with the plurality of control gate electrodes and extend from the device region to a contact region including the plurality of electrically conductive via connections. The substrate (9, 10) can comprise a silicon substrate containing a driver circuit for the NAND device.

Figure 15:
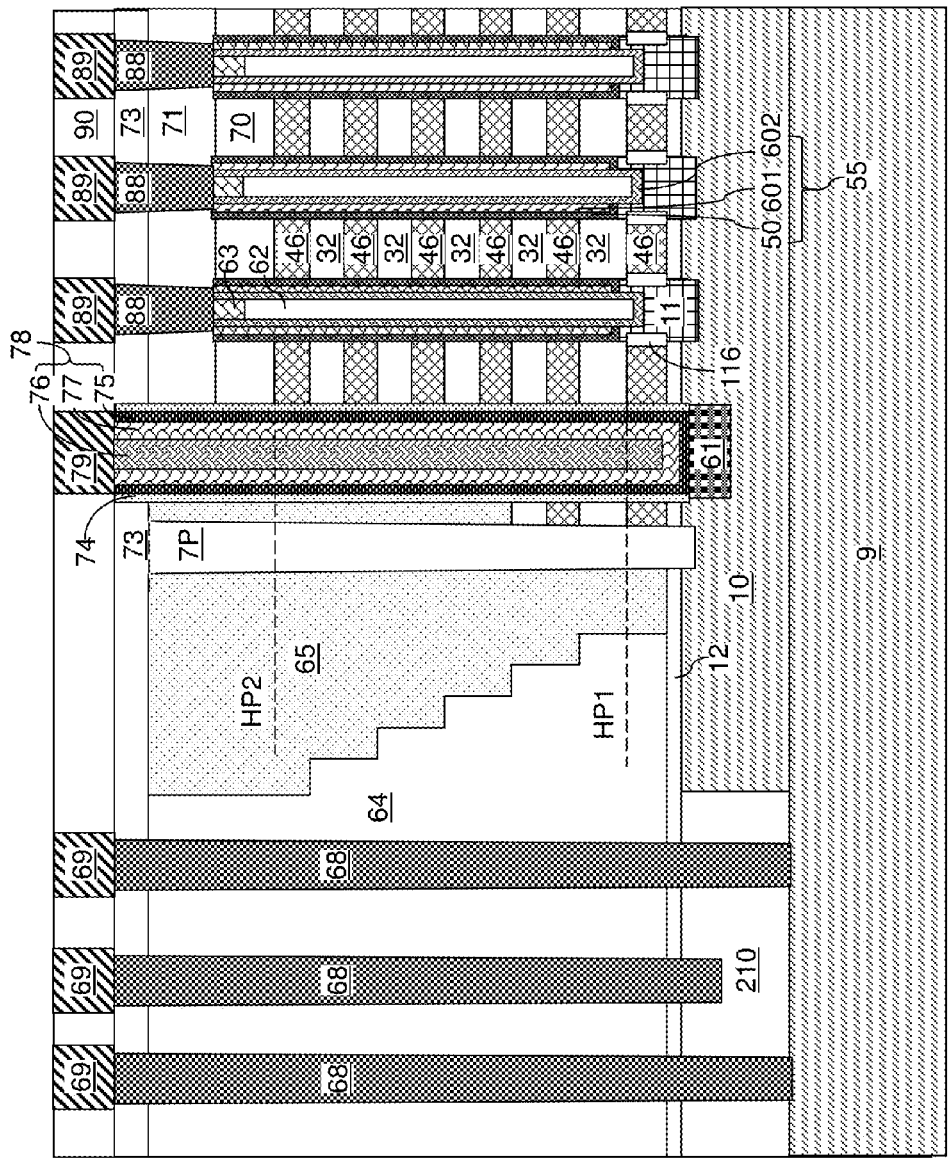
FIG. 15 is a vertical cross-sectional view of an alternate embodiment of the first exemplary structure according to the first embodiment of the present disclosure.

Referring to FIG. 15, an alternate embodiment of the first exemplary structure according to the first embodiment of the present disclosure is illustrated. The alternate embodiment of the first exemplary structure may be obtained by forming the aluminum portion 76 with a sufficiently thin bottom horizontal portion. In this case, all aluminum from the aluminum portion 76 diffuses upwards into the semiconductor (e.g., silicon) material portion 77.

In this embodiment, a bottom surface of the semiconductor (e.g., silicon) material portion 77 can contact a top surface of the horizontal portion of the diffusion barrier layer 75. In one embodiment, a horizontal portion of the diffusion barrier layer 75 can contact the top surface of the doped semiconductor portion (e.g., the source region 61) embedded in the substrate (9, 10), and can contact the entire bottom surface of the semiconductor (e.g., silicon) material portion 77. The aluminum portion 76 can be vertically spaced from the horizontal portion of the diffusion bather layer 75 by the semiconductor (e.g., silicon) material portion 77.

Figure 16:
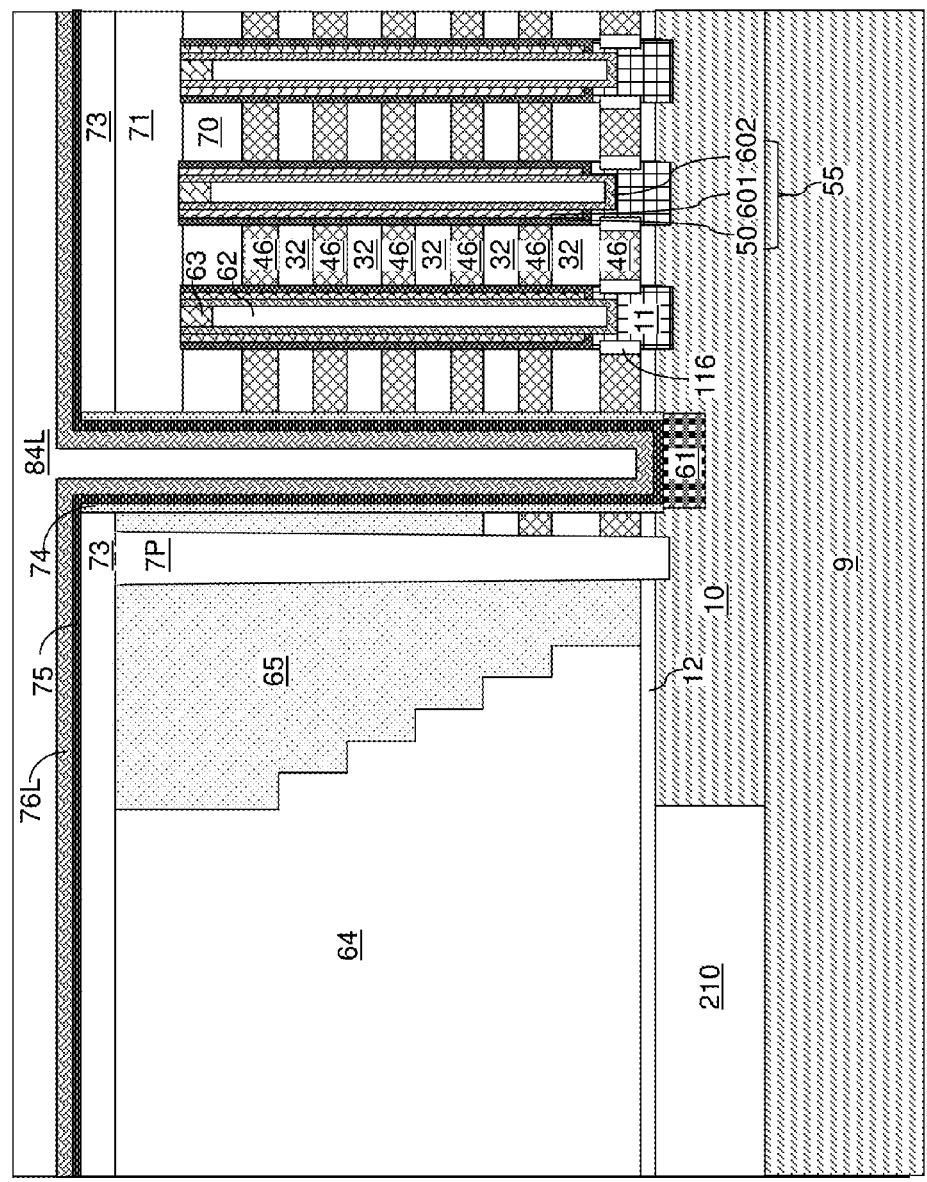
FIG. 16 is a vertical cross-sectional view of a second exemplary structure after formation of a dielectric fill material layer according to a second embodiment of the present disclosure.

Referring to FIG. 16, a second exemplary structure according to a second embodiment of the present disclosure can be derived from the first exemplary structure of FIG. 10 by depositing a non-metallic material on the deposited aluminum. For example, the non-metallic material can be a dielectric material such as silicon oxide, silicon nitride, and/or a dielectric metal oxide. The deposited dielectric material fills each vertically extending cavity within the sidewalls of the aluminum layer 76L and overlies the entire horizontal portions of the aluminum layer 76L above the contact level dielectric layers (71, 73) to form a dielectric fill material layer 84L. The dielectric fill material layer 84L can be a continuous material layer having a horizontal portion overlying the contact level dielectric layers (71, 73) and vertically extending portions that fill the cavities within the vertical portions of the aluminum layer 76L. In one embodiment, the non-metallic material (i.e., the dielectric material) of the dielectric fill material layer 84L includes silicon oxide, which can be undoped silicate glass (USG) (e.g., silicon dioxide layer deposited by CVD using a TEOS source), fluorosilicate glass (FSG), phosphosilicate glass (PSG), borophosphosilicate glass (BPSG), borosilicate glass (BSG), organosilicate glass (OSG), porous derivatives thereof, or a combination thereof.

The dielectric fill material layer 84L and the diffusion barrier layer 75 encapsulate the aluminum layer 76L (and thus the to be formed aluminum portion 76) to prevent or reduce void formation in the to be formed aluminum portion 76 during subsequent high temperature process steps.

Figure 17:
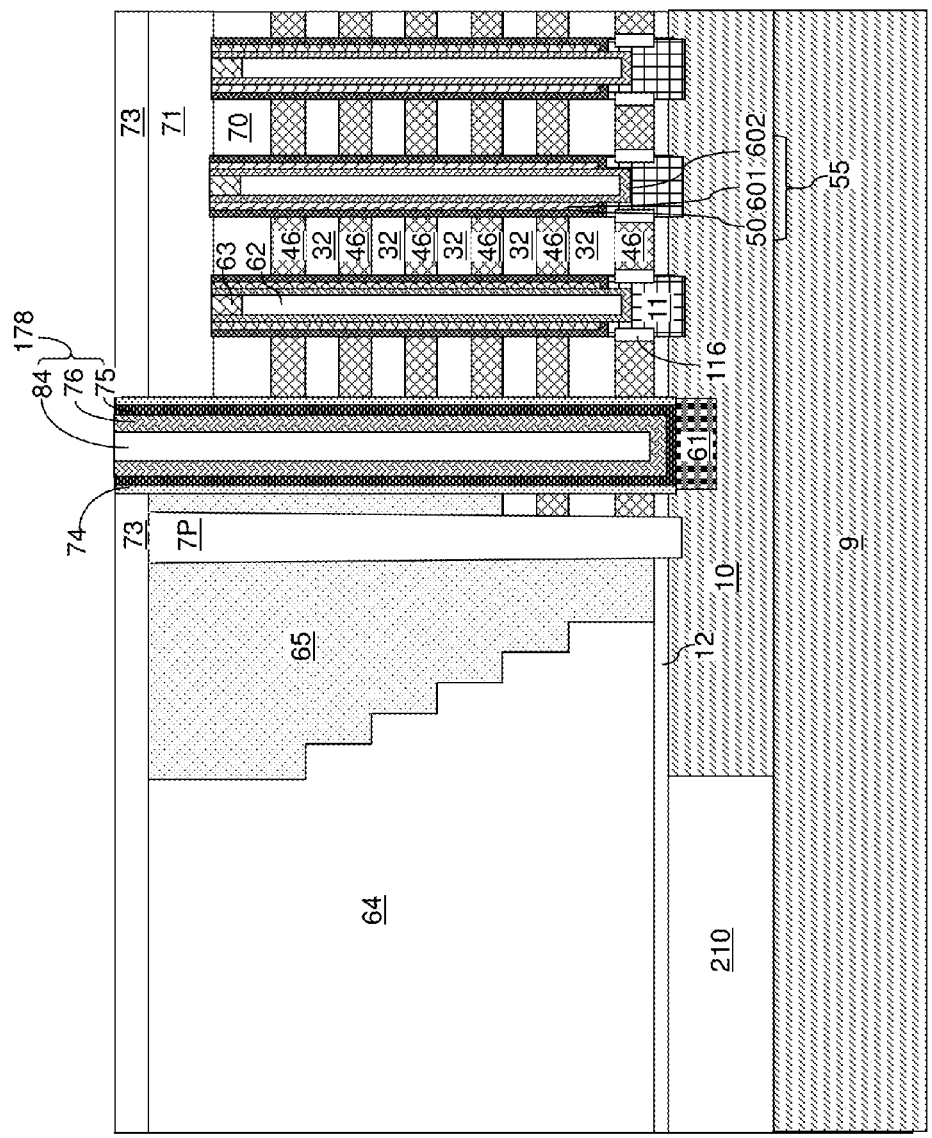
FIG. 17 is a vertical cross-sectional view of the second exemplary structure after a planarization process that forms a contact via structure according to the second embodiment of the present disclosure.

Referring to FIG. 17, a planarization process is performed to remove portions of the dielectric fill material layer 84L, the aluminum layer 76L, and the diffusion barrier layer 75 from above a horizontal plane including the top surface of the contact level dielectric layer (71, 73)). A horizontal portion of the dielectric material (as embodied in the horizontal portion of the dielectric fill material layer 84L that overlies the contact level dielectric layer (71, 73), a horizontal portion of aluminum (as embodied in the horizontal portion of the aluminum layer 76L), and a horizontal portion of the diffusion barrier layer 75 can be sequentially removed from above the alternating stack (32, 46) in that order. Removal of the various material portions of the dielectric fill material layer 84L, the aluminum layer 76L, and the diffusion barrier layer 75 can be performed employing at least one recess etch (which may be an anisotropic etch or an isotropic etch) and/or chemical mechanical planarization (CMP). In one embodiment, a series of reactive ion etch processes can be performed to remove the entire horizontal portions of the layer stack including the dielectric fill material layer 84L, the aluminum layer 76L, and the diffusion barrier layer 75, or a subset thereof. Optionally, an isotropic etch process (such as a wet etch) may be employed to remove the horizontal portion of the dielectric fill material layer 84L from above the horizontal plane including the top surface of the contact level dielectric layers (71, 73). If horizontal portions of the layer stack are not completely removed from above the top surface of the contact level dielectric layer (71, 73), a CMP process and/or at least one additional wet and/or dry etch process can be employed to complete the planarization process.

Each backside trench 79 includes a dielectric spacer 74, a remaining portion of the diffusion bather layer 75, a remaining portion of the aluminum layer 76L which is herein referred to as an aluminum portion 76, and a remaining portion of the dielectric fill material layer 84L, which is herein referred to as dielectric material portion 84 (which is a non-metallic material portion). The diffusion barrier layer 75 is laterally surrounded by, and contacted by, the insulating spacer 74. Within each backside trench 79, the cavity 79' that is present immediately after formation of the diffusion barrier layer 75 in one of the processing steps of FIG. 10 can be filled with a combination of an aluminum portion 76 and a non-metallic material portion as embodied in a dielectric material portion 84. The combination of the aluminum portion 76 and the dielectric material portion 84 and a portion of the diffusion barrier layer 75 constitute a contact via structure 178 (which is a source contact via structure). The contact via structure 178 extends through the alternating stack (32, 46) and contacts a top surface of a doped semiconductor portion (i.e., a source region 61) embedded in the substrate (9, 10).

Figure 18:
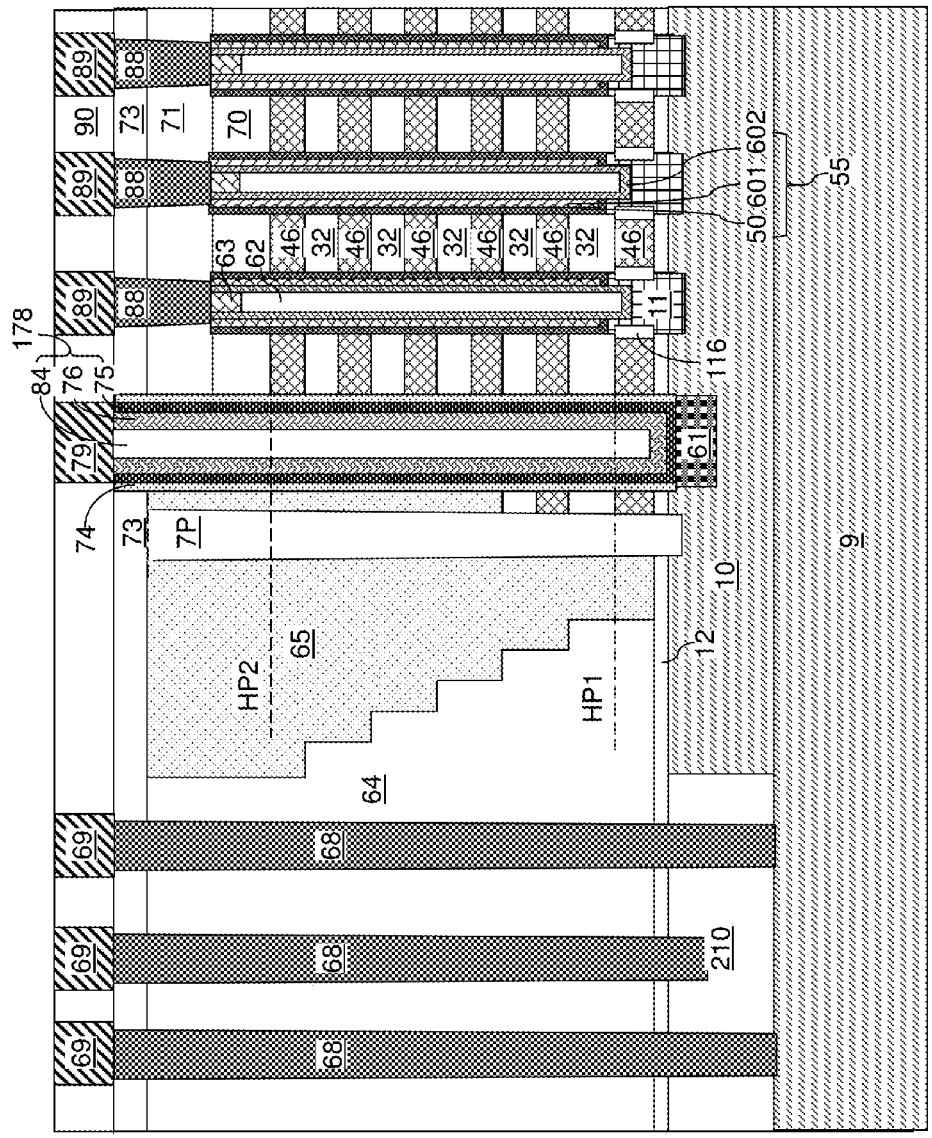
FIG. 18 is a vertical cross-sectional view of the second exemplary structure after formation of additional contact via structures and metal lines according to the second embodiment of the present disclosure.

Referring to FIG. 18, the processing steps of FIG. 14 can be performed to form additional contact via structures (88, 68), a line level dielectric layer 90, and various metal lines (79, 89, 69). The metal lines (79, 89, 69) which can include, for example, a source line 79 that contacts the contact via structure 178, bit lines 89 that contact the drain contact via structures 88, and peripheral device lines 69 that contact peripheral device contact structures 68. Additional metal interconnect structures (not shown) and interlayer dielectric material layers (not) shown can be formed over the first exemplary structure to provide additional electrical wiring.

The second exemplary structure includes an alternating stack of insulating layers 32 and electrically conductive layers 46 located over a substrate (9, 10), and a contact via structure 178 extending through the alternating stack (32, 46), contacting a top surface of a doped semiconductor portion (i.e., a source region 61) embedded in the substrate (9, 10). The contact via structure 178 comprises a diffusion barrier layer 75 comprising a conductive metallic compound of at least one elemental metal and at least one non-metallic element, and a combination of an aluminum portion 76 and a non-metallic material portion 84. The combination (76, 84) is laterally surrounded by the diffusion bather layer 75.

In one embodiment, the non-metallic material portion comprises a dielectric material portion 84 including a dielectric material selected from silicon oxide, silicon nitride, and a dielectric metal oxide. The aluminum portion 76 can laterally surround the dielectric material portion 84. An outer sidewall of the aluminum portion 76 can contact an inner sidewall of the diffusion barrier layer 75, and an inner sidewall of the aluminum portion 76 can contact a sidewall of the dielectric material portion 84.

In one embodiment, each of the aluminum portion 76 and the non-metallic material portion (i.e., the dielectric material portion 84) can extend from a first horizontal plane HP1 including a top surface of a bottommost layer within the alternating stack (32, 46) to a second horizontal plane HP2 including a top surface of the topmost layer within the alternating stack (32, 46). In one embodiment, a horizontal portion of the diffusion barrier layer 75 can contact the top surface of the doped semiconductor portion (e.g., a source region 61) embedded in the substrate (9, 10) and a bottom surface of the aluminum portion 76, and the non-metallic portion (i.e., the dielectric material portion 84) can be vertically spaced from the horizontal portion of the diffusion barrier layer 75 by the aluminum portion 76.

In one embodiment, a metal line 79 can contact a top surface of the aluminum portion 76 and a top surface of the non-metallic material portion (as embodied as the dielectric material portion 84). In one embodiment, an insulating spacer 74 laterally surrounds the contact via structure 178 and electrically isolates the contact via structure 178 from the electrically conductive layers 46.

In one embodiment, at least one memory stack structure 55 extending through the alternating stack (32, 46) is provided. Each of the at least one memory stack structure 55 includes, from inside to outside, a semiconductor channel 60, a tunneling dielectric layer 506 laterally surrounding the semiconductor channel 60, and a vertical stack of charge storage regions (as embodied as portions of the memory material layer 504 at each level of the conductive material layers 46 and vertically spaced by portions of the memory material layer 504 at each level of the insulating layers 32) which laterally surrounds the tunneling dielectric layer 506.

In one embodiment, the structure comprises a three-dimensional memory device that comprises a vertical NAND device formed in a device region 110. The electrically conductive layers 46 can comprise, or can be electrically connected to, a respective word line of the NAND device as embodied as portions of the electrically conductive layers 46. The device region 100 can include a plurality of semiconductor channels 60, wherein at least one end portion of each of the plurality of semiconductor channels 60 extends substantially perpendicular to a top surface of the substrate (9, 10), a plurality of charge storage regions as embodied as discrete portions of the memory material layer 504 that are located adjacent to the electrically conductive layers, and a plurality of control gate electrodes having a strip shape extending substantially parallel to the top surface of the substrate (9, 10). Each charge storage region is located adjacent to a respective one of the plurality of semiconductor channels 60. Each of the control gate electrodes comprises a portion of a respective electrically conductive layer 46 that is proximal to the memory material layer 504. In one embodiment, the plurality of control gate electrodes comprise at least a first control gate electrode located in a first device level and a second control gate electrode located in a second device level. The electrically conductive layers in the stack can be in electrical contact with the plurality of control gate electrodes and extend from the device region to a contact region including the plurality of electrically conductive via connections. The substrate (9, 10) can comprise a silicon substrate containing a driver circuit for the NAND device.

Figure 19:
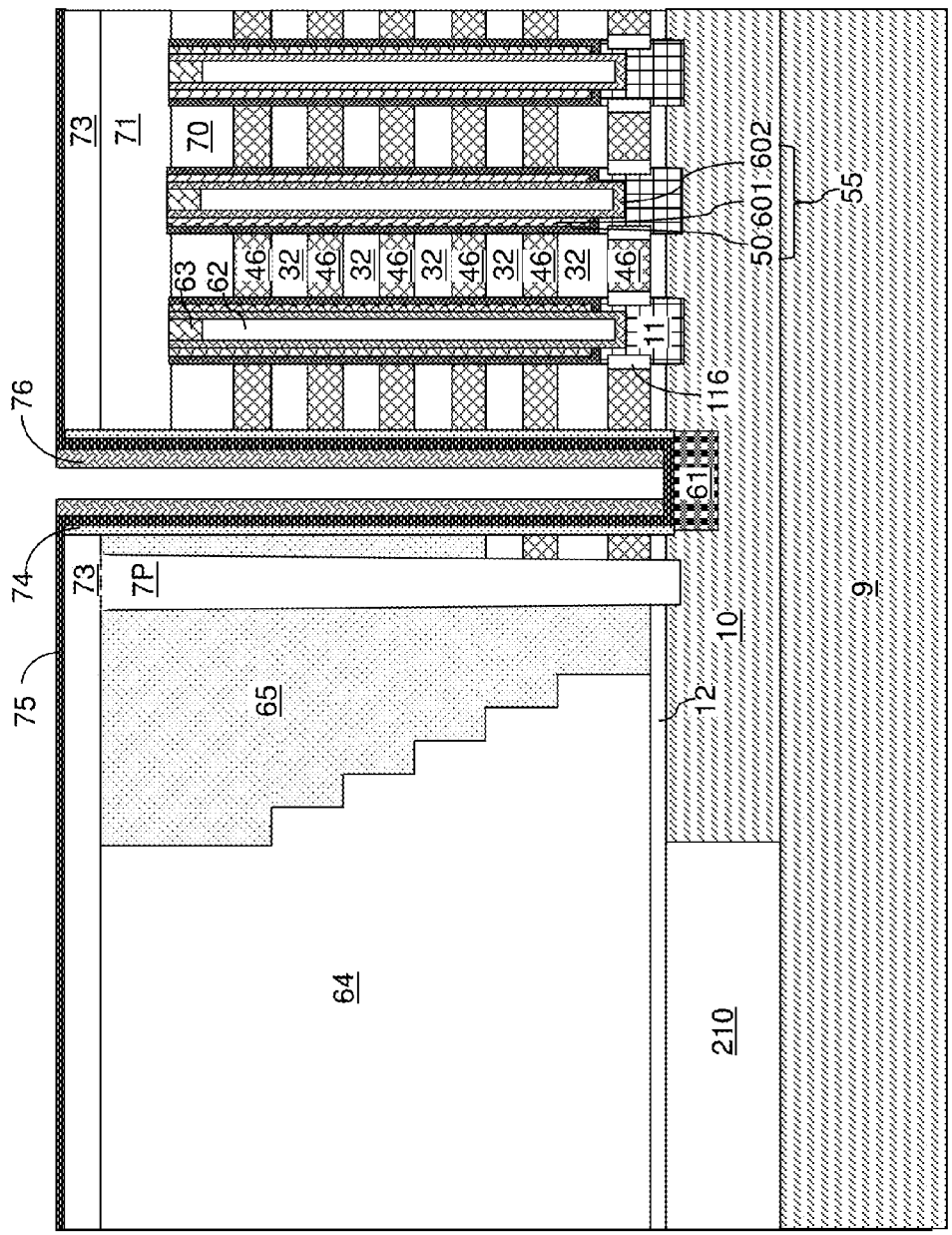
FIG. 19 is a vertical cross-sectional view of an alternate embodiment of the second exemplary structure after an anisotropic etch that forms a sidewall spacer portion according to the second embodiment of the present disclosure.

Referring to FIG. 19, an alternate embodiment of the second exemplary structure according to the second embodiment of the present disclosure can be derived from the second exemplary structure of FIG. 10 by performing an anisotropic etch that removes horizontal portions of the aluminum layer 76L. The anisotropic etch can be a dry etch such as a reactive ion etch. The anisotropic etch can be selective to the material of the diffusion barrier layer 75. Each remaining vertical portion of the aluminum layer 76L within the backside trenches 79 constitutes an aluminum portion 76, which can be a sidewall spacer aluminum portion. As used herein, a sidewall spacer element refers to a vertically extending element along a sidewall of an opening, such as a sidewall of trench, and which includes a vertically extending through-cavity therein.

Figure 20:
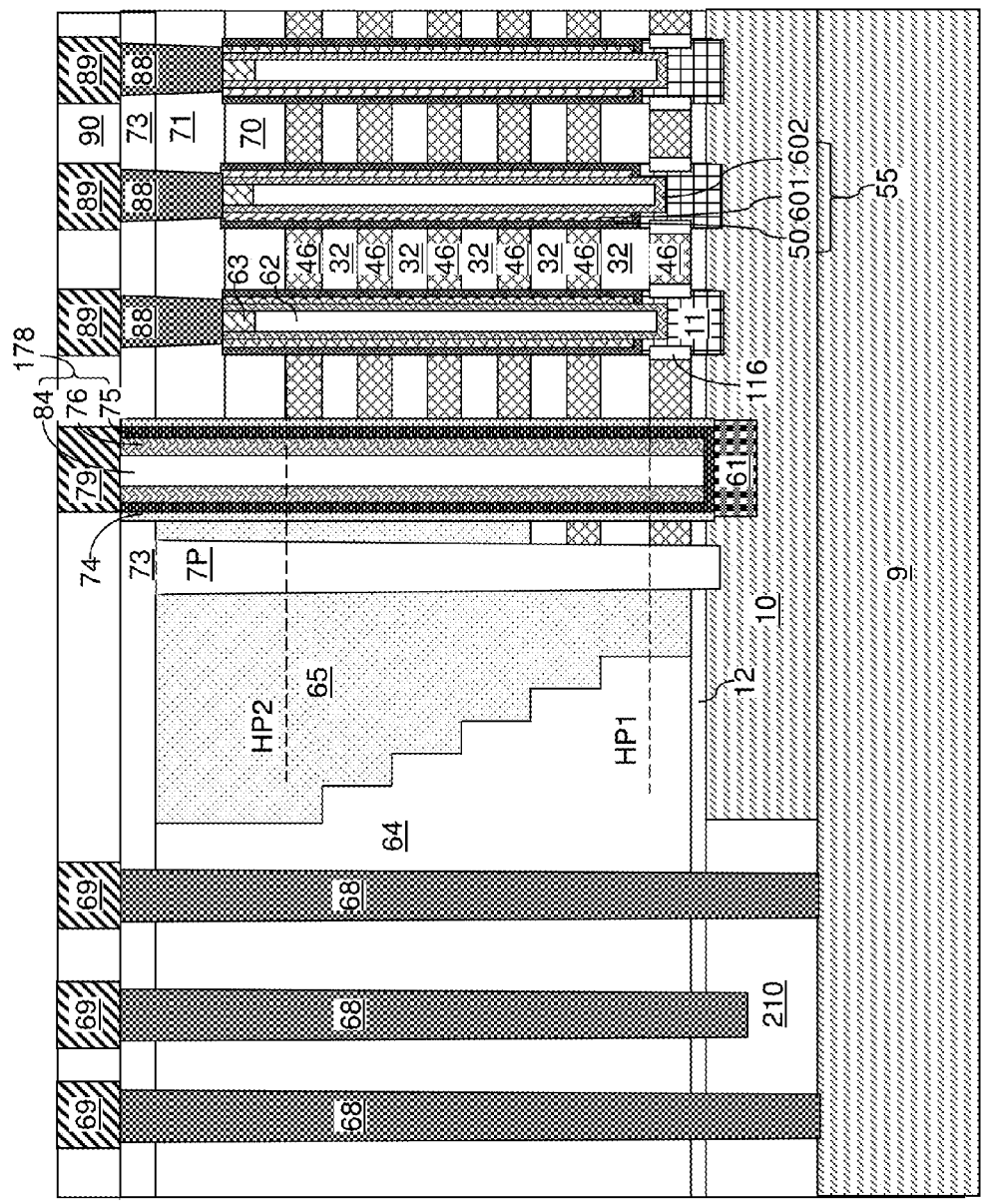
FIG. 20 is a vertical cross-sectional view of the alternate embodiment of the second exemplary structure after forma-

Referring to FIG. 20, the processing steps of FIGS. 16, 17, and 18 can be sequentially performed to form a contact via structure 178. The dielectric fill material layer 84L can be formed directly on each top surface of the horizontal portions of the diffusion barrier layer 75 located at the bottom of the backside trenches 79. Thus, each dielectric material portion 84 can contact the top surface of the underlying horizontal portion of the diffusion barrier layer 75. Within each backside trench 79, a horizontal portion of the diffusion barrier layer 75 contacts the top surface of the doped semiconductor portion (e.g., a source region 61) embedded in the substrate (9, 10), a bottom surface of the aluminum portion 76, and a bottom surface of the non-metallic portion (which is the dielectric material portion 84).

While contact via structures include a barrier layer, an aluminum portion and a non-metallic portion (e.g., silicon or dielectric material portion are described above), in alternative embodiments, one or more additional portions may be included in the contact via structure in addition to or instead of one or more of the above described portions. For example, a metal silicide portion, such as a self aligned silicide ("salicide") portion may be included in the contact via structure. In one configuration, a buried salicide portion may be formed at the top of the contact via structure by recessing the dielectric material portion 84 at the top of the contact via structure to form a recess, forming a metal and silicon (e.g., amorphous silicon) layers in the recess and annealing the layers to form a metal silicide (e.g., salicide) at the top of the contact via structure. The salicide region may then be buried under silicon oxide cover layer. In another configuration, the salicide portion may be formed throughout the height of the contact via structure by depositing a metal layer and a silicon layer into the trench 79 followed by annealing the layers to form the salicide portion. Any suitable metal materials may be used for the salicide portion, such as Ni, Co, W, Ti, etc. A monosalicide (e.g. having one metal to one silicon atom ratio), such as NiSi or a disalicide (e.g., having one metal to two silicon), such as $NiSi_2$ or $CoSi_2$, or a dimetal salicide (e.g., having two metal to one silicon atom ratio), such as $Ni_2Si$ may be formed.

The various contact via structures of the present disclosure can provide less stress to surrounding regions compared to contact via structures consisting of metallic materials such as a combination of a TiN liner and a W fill portion. The combination of aluminum and the non-metallic material, which can be a semiconductor material or a dielectric material, provides a structure with a lower Young's modulus, thereby reducing or preventing warping of the substrate and deformation of the structure embedding the contact via structures of the present disclosure. The structure of the present disclosure can be incorporated into semiconductor devices to enhance yield and to improve reliability. The portions 77 or 84 can act as an encapsulant for the aluminum portion 76 to prevent or reduce void formation in the aluminum portion. Furthermore, the MIC process improves the conductivity of the silicon portion 77 which improves the conductivity of the contact via structure 78.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A structure comprising:
    an alternating stack of insulating layers and electrically conductive layers located over a substrate; and
    a contact via structure extending through the alternating stack;
    wherein the contact via structure comprises:
        an electrically conductive diffusion barrier layer; and
        a combination of an aluminum portion and a non-metallic material portion, wherein the combination of the aluminum portion and the non-metallic material portion is laterally surrounded by the diffusion barrier layer.
2. The structure of claim 1, wherein:
    lateral sides of the combination of the aluminum portion and the non-metallic material portion are surrounded by the diffusion barrier layer; and
    the diffusion barrier layer comprises a conductive metallic compound of at least one elemental metal and at least one non-metallic element.
3. The structure of claim 1, wherein:
    the non-metallic material portion comprises a semiconductor material portion; and
    the semiconductor material portion laterally surrounds the aluminum portion.
4. The structure of claim 3, wherein:
    the semiconductor material portion comprises an aluminum doped single crystal silicon portion or an aluminum doped polysilicon portion;
    an outer sidewall of the semiconductor material portion contacts an inner sidewall of the diffusion barrier layer; and
    an inner sidewall of the semiconductor material portion contacts an outer sidewall of the aluminum portion.
5. The structure of claim 3, wherein:
    a bottom surface of the aluminum portion contacts a top surface of the horizontal portion of the diffusion barrier layer; and
    a bottom surface of the semiconductor material portion is located above, and is vertically spaced from, a top surface of a horizontal portion of the diffusion barrier layer by the aluminum portion.
6. The structure of claim 1, wherein the non-metallic material portion comprises a dielectric material portion.
7. The structure of claim 6, wherein the aluminum portion laterally surrounds the dielectric material portion.
8. The structure of claim 7, wherein:
    the dielectric material portion comprises a dielectric material selected from silicon oxide, silicon nitride, and a dielectric metal oxide;
    an outer sidewall of the aluminum portion contacts an inner sidewall of the diffusion barrier layer; and
    an inner sidewall of the aluminum portion contacts a sidewall of the dielectric material portion.
9. The structure of claim 1, wherein each of the aluminum portion and the non-metallic material portion extends from a first horizontal plane including a top surface of a bottommost layer within the alternating stack to a second horizontal plane including a top surface of the topmost layer within the alternating stack.
10. The structure of claim 1, wherein:
    a bottom of the contact via structure contacts a top surface of a doped semiconductor portion;
    the electrically conductive layers comprise word lines;
    the doped semiconductor portion comprises a source region located in the substrate;
    a horizontal portion of the diffusion barrier layer contacts the top surface of the source region and a bottom surface of the aluminum portion; and
    the non-metallic portion is vertically spaced from the horizontal portion of the diffusion barrier layer by the aluminum portion.
11. The structure of claim 10, further comprising:
    a source line contacting a top surface of the aluminum portion and a top surface of the non-metallic material portion;
    an insulating spacer laterally surrounding the contact via structure and electrically isolating the contact via structure from the word lines; and
    at least one memory stack structure extending through the alternating stack, wherein each of the at least one memory stack structure comprises, from inside to outside:
    a semiconductor channel;
    a tunneling dielectric layer laterally surrounding the semiconductor channel; and
    charge storage regions laterally surrounding the tunneling dielectric layer.
12. The structure of claim 1, wherein:
    the structure comprises a three-dimensional memory device that comprises a vertical NAND device formed in a device region;
    the electrically conductive layers comprise, or are electrically connected to, a respective word line of the NAND device;
    the device region comprises:
        a plurality of semiconductor channels, wherein at least one end portion of each of the plurality of semiconductor channels extends substantially perpendicular to a top surface of the substrate;
        a plurality of charge storage regions, each charge storage region located adjacent to a respective one of the plurality of semiconductor channels; and a plurality of control gate electrodes having a strip shape extending substantially parallel to the top surface of the substrate;

the plurality of control gate electrodes comprise at least a first control gate electrode located in a first device level and a second control gate electrode located in a second device level;

the electrically conductive layers in the stack are in electrical contact with the plurality of control gate electrodes and extend from the device region to a contact region including the plurality of electrically conductive via connections; and the substrate comprises a silicon substrate containing a driver circuit for the NAND device.

13. A method of manufacturing a structure, comprising:
forming an alternating stack comprising insulating layers and electrically conductive layers over a substrate;
forming a trench extending to the substrate through the alternating stack;
forming an insulating spacer on a sidewall of the trench, wherein a cavity is provided within the insulating spacer;
forming an electrically conductive diffusion barrier layer in the cavity; and
filling a remaining portion of the cavity with a combination of an aluminum portion and a non-metallic material portion, wherein the combination of the aluminum portion and the non-metallic material portion and a portion of the diffusion barrier layer constitute a contact via structure extending through the alternating stack and contacting a top surface of a doped semiconductor portion.

14. The method of claim 13, wherein the combination of the aluminum portion and the non-metallic material portion is formed by:
depositing aluminum on the metallic barrier layer;
depositing a non-metallic material on the deposited aluminum; and
removing portions of the deposited aluminum and deposited non-metallic material from above a horizontal plane located above the alternating stack.

15. The method of claim 14, wherein the non-metallic material comprises a semiconductor material.

16. The method of claim 15, wherein the semiconductor material comprises amorphous silicon or smaller grain size polysilicon.

17. The method of claim 16, further comprising annealing the structure to perform a metal induced crystallization of the amorphous silicon or smaller grain size polysilicon to convert the amorphous silicon or smaller grain size polysilicon to either single crystal silicon or larger grain size polysilicon.

18. The method of claim 17, wherein the aluminum portion and the semiconductor material exchange places during the metal induced crystallization such that a portion of the single crystal silicon or larger grain size polysilicon surrounds a vertically extending portion of aluminum after the step of annealing.

19. The method of claim 18, wherein the single crystal silicon or larger grain size polysilicon comprises aluminum doped single crystal silicon or larger grain size polysilicon.

20. The method of claim 14, wherein the non-metallic material comprises a dielectric material selected from silicon oxide, silicon nitride, and a dielectric metal oxide.

21. The method of claim 13, further comprising forming a salicide portion in the contact via structure.

22. The method of claim 13, further comprising:
forming an in-process alternating stack of the insulating layers and sacrificial material layers;
forming at least one memory stack structure extending through the in-process stack;
removing the sacrificial material layers by introducing into the trench an etchant that etches the sacrificial material layers selective to the insulating layers through the trench; and
forming the electrically conductive layers in recesses formed by removal of the sacrificial material layers, thereby forming the alternating stack of the insulating layers and the electrically conductive layers.

23. The method of claim 22, wherein:
the contact via structure comprises a source contact via structure;
the doped semiconductor portion comprises a source region;
the electrically conductive layers comprise word lines; and
each of the at least one memory stack structure comprises, from inside to outside:
a semiconductor channel;
a tunneling dielectric layer laterally surrounding the semiconductor channel; and
charge storage regions laterally surrounding the tunneling dielectric layer.

24. The method of claim 13, wherein:
the structure comprises a three-dimensional memory device that comprises a vertical NAND device formed in a device region;
the electrically conductive layers comprise, or are electrically connected to, a respective word line of the NAND device;
the device region comprises:
a plurality of semiconductor channels, wherein at least one end portion of each of the plurality of semiconductor channels extends substantially perpendicular to a top surface of the substrate;
a plurality of charge storage regions, each charge storage region located adjacent to a respective one of the plurality of semiconductor channels; and
a plurality of control gate electrodes having a strip shape extending substantially parallel to the top surface of the substrate;
the plurality of control gate electrodes comprise at least a first control gate electrode located in a first device level and a second control gate electrode located in a second device level;
the electrically conductive layers in the stack are in electrical contact with the plurality of control gate electrodes and extend from the device region to a contact region including the plurality of electrically conductive via connections; and
the substrate comprises a silicon substrate containing a driver circuit for the NAND device.

25. A method of manufacturing a structure, comprising:
forming an alternating stack comprising insulating layers and electrically conductive layers over a substrate;
forming an opening extending through the alternating stack;
forming an insulating spacer on a sidewall of the opening, wherein a cavity is provided within the insulating spacer;
forming an electrically conductive diffusion barrier layer in the cavity; and filling a remaining portion of the cavity with a combination of an aluminum portion and a non-metallic material portion, wherein the combination of the aluminum portion and the non-metallic material portion and a portion of the diffusion barrier layer constitute a contact via structure extending through the alternating stack.

26. The method of claim 25, wherein:

the non-metallic material comprises amorphous silicon or smaller grain size polysilicon; and the combination of the aluminum portion and the non-metallic material portion is formed by:
  depositing aluminum on the metallic barrier layer;
  depositing a non-metallic material on the deposited aluminum; and
  removing portions of the deposited aluminum and deposited non-metallic material from above a horizontal plane located above the alternating stack.

27. The method of claim 26, further comprising annealing the structure to perform a metal induced crystallization of the amorphous silicon or smaller grain size polysilicon to convert the amorphous silicon or smaller grain size polysilicon to either single crystal silicon or larger grain size polysilicon, wherein the aluminum portion and the semiconductor material exchange places during the metal induced crystallization such that a portion of the single crystal silicon or larger grain size polysilicon surrounds a vertically extending portion of aluminum after the step of annealing.

* * * * *